United States Patent
Chan et al.

(10) Patent No.: US 9,583,167 B2
(45) Date of Patent: Feb. 28, 2017

(54) LOW POWER MEMORY CELL WITH HIGH SENSING MARGIN

(71) Applicant: GLOBALFOUNDRIES Singapore Pte. Ltd., Singapore (SG)

(72) Inventors: Tze Ho Simon Chan, Singapore (SG); Yang Hong, Singapore (SG); Yong Wee Francis Poh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/698,882

(22) Filed: Apr. 29, 2015

(65) Prior Publication Data

US 2016/0322090 A1 Nov. 3, 2016

(51) Int. Cl.
| | | |
|---|---|---|
| *G11C 11/00* | (2006.01) | |
| *G11C 11/16* | (2006.01) | |
| *H01L 43/02* | (2006.01) | |
| *H01L 43/08* | (2006.01) | |
| *H01L 43/12* | (2006.01) | |
| *H01L 27/22* | (2006.01) | |

(52) U.S. Cl.
CPC ........ *G11C 11/161* (2013.01); *G11C 11/1673* (2013.01); *G11C 11/1675* (2013.01); *H01L 27/226* (2013.01); *H01L 43/02* (2013.01); *H01L 43/08* (2013.01); *H01L 43/12* (2013.01)

(58) Field of Classification Search
CPC ......... G11C 11/16; G11C 11/15; G11C 5/063; G11C 5/08; G11C 2211/5614
USPC ........................................ 365/158, 171, 173
See application file for complete search history.

(56) References Cited

U.S. PATENT DOCUMENTS

2013/0258750 A1\* 10/2013 Kim ...................... G11C 11/161
365/145
2016/0035405 A1\* 2/2016 Kawasumi .......... G11C 11/1697
365/72

\* cited by examiner

*Primary Examiner* — Huan Hoang
(74) *Attorney, Agent, or Firm* — Horizon IP Pte. Ltd.

(57) ABSTRACT

Memory cell, method for operating the memory cell and method of forming the memory cell are disclosed. The memory cell includes a first selector having a first select transistor with a first gate coupled to a first wordline and first and second source/drain (S/D) regions, and a second selector having at least a second select transistor with a second gate coupled to a second wordline and first and second S/D regions. The memory cell includes a first magnetic tunnel junction (MTJ) element coupled between a first bit line and the first S/D region of the first select transistor, and a second MTJ element coupled between a second bit line and the first S/D region of the second select transistor.

20 Claims, 29 Drawing Sheets

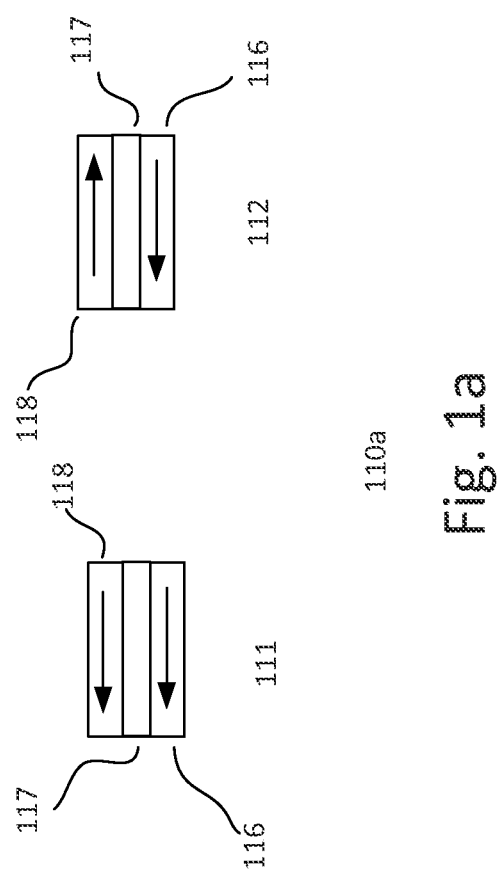

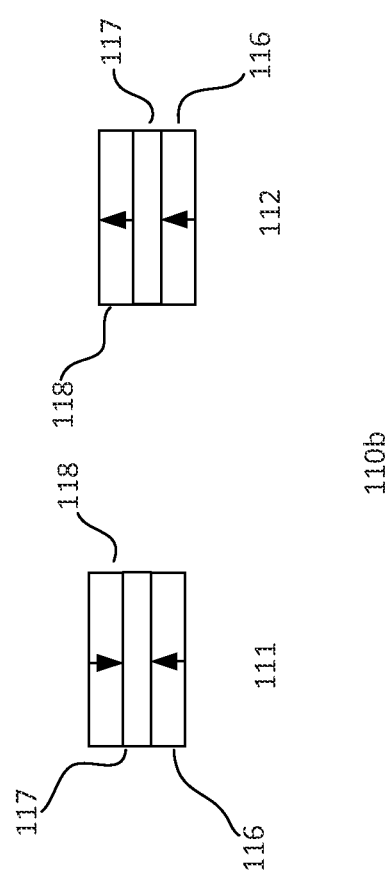

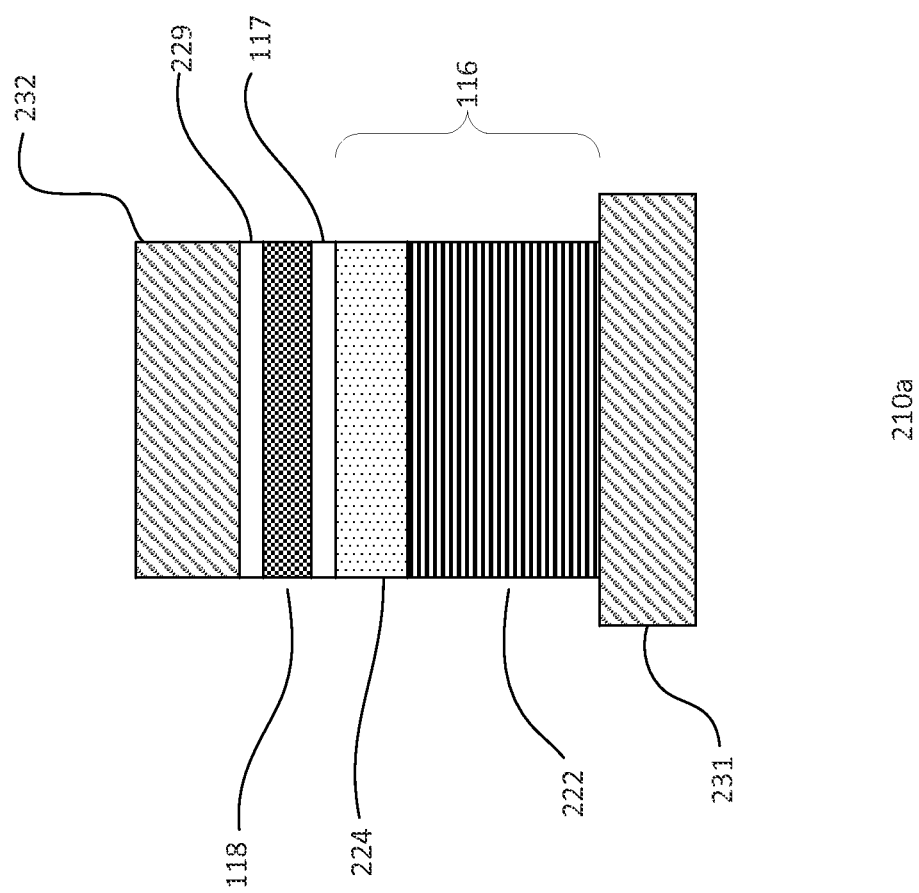

US 9,583,167 B2

LOW POWER MEMORY CELL WITH HIGH SENSING MARGIN

BACKGROUND

A magnetic memory cell stores information by changing electrical resistance of a magnetic tunnel junction (MTJ) element. The MTJ element typically includes a fixed (pinned) magnetic layer and a free magnetic layer. The fixed (pinned) magnetic layer and the free magnetic layer are laminated such that a tunnel barrier film is formed between the two layers. The magnetic orientation of the free layer flips by a direction or an opposite direction of electric currents exceeding a critical select current. The electrical resistance of the MTJ element changes corresponding to that of the magnetic orientation of the free layer relating to the fixed magnetic layer, which may be in either a parallel state or an anti-parallel state.

However, conventional magnetic memory cells require high currents for programming. This results in high power consumption. Additionally, magnetic memory cells suffer from low sensing margin. Low sensing margin creates reliability issues.

From the foregoing discussion, it is desirable to provide low power memory cells with high sensing margin.

SUMMARY

Embodiments of the present disclosure generally relate to semiconductor devices. More particularly, some embodiments relate to memory devices, such as magnetic memory devices. For example, the magnetic memory devices may be spin transfer torque magnetoresistive random access memory (STT-MRAM) devices. Such memory devices, for example, may be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

In one embodiment, a memory cell is disclosed. The memory cell includes a first selector having a first select transistor with a first gate coupled to a first wordline and first and second source/drain (S/D) regions, and a second selector having at least a second select transistor with a second gate coupled to a second wordline and first and second S/D regions. The memory cell includes a first magnetic tunnel junction (MTJ) element coupled between a first bit line and the first S/D region of the first select transistor, and a second MTJ element coupled between a second bit line and the first S/D region of the second select transistor.

In another embodiment, a method of operating a memory cell is presented. The method includes providing a memory cell which includes a first selector having a first select transistor with a first gate terminal coupled to a first wordline and first and second S/D terminals, a second selector having a second select transistor with a second gate terminal coupled to a second wordline and first and second S/D terminals, and a third select transistor with a third gate terminal coupled to the second wordline. The first S/D terminals of the second and third select transistors are a common first S/D terminal. The memory cell includes a first magnetic tunnel junction (MTJ) element coupled between a first bit line and the first S/D terminal of the first select transistor, and a second MTJ element coupled between a second bit line and the first S/D terminals of the second and third select transistors. The method also includes performing a read operation or write operation with the memory cell.

In yet another embodiment, a method for forming a memory cell is disclosed. The method includes providing cell selector unit on a substrate. A first selector having a first select transistor with a first gate and first and second S/D regions is formed. A second selector having at least a second select transistor with a second gate and first and second S/D regions is formed. The second S/D regions of the first and second select transistors are a common second S/D region. A cell dielectric layer is provided on the substrate. A storage unit is formed in the cell dielectric layer. First and second magnetic tunnel junction (MTJ) elements are formed. An upper metal level is formed over the cell dielectric layer. This includes forming first and second bitlines in the upper metal level. The first MTJ element is coupled between the first bit line and the first S/D region of the first select transistor; and the second MTJ element is coupled between the second bit line and the first S/D region of the second select transistor.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1b show diagrams of parallel state and anti-parallel state of a MTJ element.

FIGS. 2a-2b show cross-sectional views of embodiments of MTJ elements.

DETAILED DESCRIPTION

Figure 2B:
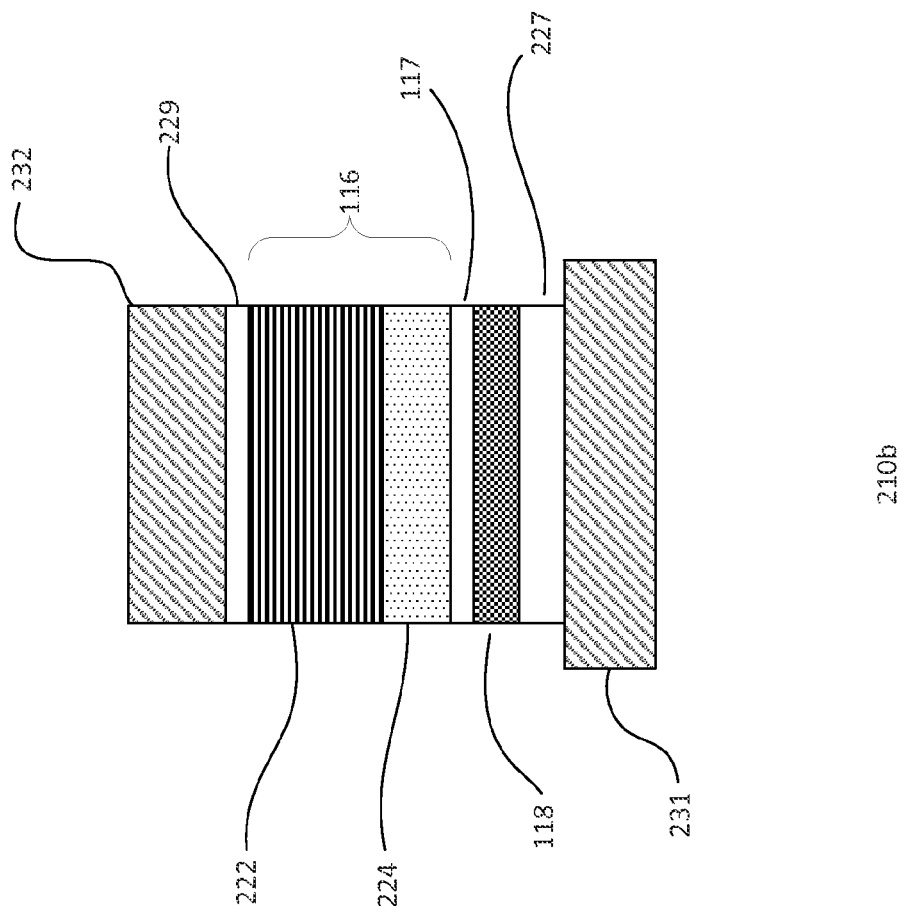

Embodiments of the present disclosure generally relate to memory cells. In one embodiment, the memory cells are magnetic resistive memory cells. Magnetic resistive memory cells include magnetic tunneling junction (MTJ) elements. Other suitable types of resistive memory cells may also be useful. The memory cells are configured to produce fast write time and high sensing margin. The memory cells can be incorporated into or used with, for example, electronic products such as mobile phones, smart card, mass storage, enterprise storage and industrial and automotive products.

FIG. 1a shows a simplified cross-sectional view of an embodiment of a MTJ element 110a. As shown, the magnetization or magnetic orientations of the magnetic element is configured to be in the horizontal direction. Horizontal direction, for example, refers to the direction along or parallel to the surface of a substrate. A MTJ element includes a magnetically fixed (pinned) layer 116, a tunneling barrier layer 117 and a magnetically free layer 118. The magnetic orientation of the fixed layer is fixed while the magnetic orientation of the free layer may be programmed to be in a first or same direction as the fixed layer or in a second or opposite direction as the fixed layer. For example, as shown by structure 111, the magnetic direction of the free layer is programmed to be in the first or parallel direction as the fixed layer. The corresponding MTJ electrical resistance between the free layer 118 and the fixed layer 116 is denoted as $R_P$. Structure 112 illustrates that the magnetization of the free layer is programmed to be in a second or anti-parallel direction as the fixed layer. The corresponding MTJ electrical resistance between the free layer 118 and the fixed layer 116 is denoted as $R_{AP}$. The resistance $R_{AP}$ is higher than resistance $R_P$.

FIG. 1b shows vertical alignment of magnetic orientations in the magnetic layers of a MTJ element 110b. Vertical, for example, refers to the direction perpendicular to a substrate surface. As shown in FIG. 1b, MTJ element 110b includes a fixed (pinned) layer 116, a barrier layer 117 and a free layer 118. When MTJ element 110b is in a magnetic anti-parallel state, magnetic orientations of the free layer 118 and the fixed layer 116 are in opposite directions as shown by structure 111. The corresponding MTJ electrical resistance between the free layer 118 and the fixed layer 116 is denoted as $R_{AP}$. When MTJ element 110b is in a magnetic parallel state, magnetic orientations of the free layer 118 and the fixed layer 116 are in the same direction as shown by structure 12. The corresponding MTJ electrical resistance between the free layer 118 and the fixed layer 116 is denoted as $R_P$.

FIGS. 2a-2b show cross-sectional views of exemplary embodiments of MTJ stacks or elements. FIG. 2a shows a bottom-pinned MTJ element 210a and FIG. 2b shows a top-pinned MTJ element 210b. Top and bottom refer to position of layers relative to the substrate surface.

As shown in FIG. 2a, bottom-pinned MTJ stack 210a includes a bottom electrode 231, a magnetically fixed (pinned) layer 116, a tunneling barrier layer 117, a magnetically free layer 118, a cap layer 229 and a top electrode layer 232 on the cap layer 229. The fixed layer 116, in one embodiment, includes a magnetic layer 224 and a pinning layer 222 on the bottom electrode 231. The pinning layer, for example, pins the magnetization direction of the magnetic layer, forming a pinned layer.

The free layer may be CoFeB, the tunneling barrier layer may be MgO or $Al_2O_3$, and the magnetic layer may be CoFeB/Ru/CoFeB. As for the pinning layer, it may be PtMn or IrMn. The top and bottom electrodes may be TaN or Ta. Other suitable configurations or materials for the MTJ stack may also be useful.

As shown in FIG. 2b, top-pinned MTJ stack 210b includes a bottom electrode 231, a buffer layer 227, a free layer 118, a tunneling barrier layer 117, a fixed layer 116, a cap layer 229 and a top electrode layer 232 on the cap layer 229. The fixed layer 116, in one embodiment, includes a magnetic layer 224 and a pinning layer 222. The pinning layer, for example, pins the magnetization direction of the magnetic layer, forming a pinned layer.

The free layer may be CoFeB, the tunneling barrier layer may be MgO of $Al_2O_3$, and the free layer may be CoFeB/Ru/CoFeB. As for the pinning layer, it may be PtMn or IrMn. The top and bottom electrodes may be TaN or Ta and the buffer layer may be Ru. The buffer layer, for example, serves to prevent diffusion of the material of the bottom electrode into the tunneling barrier layer. Other suitable configurations or materials for the MTJ stack may also be useful.

Figure 3A:
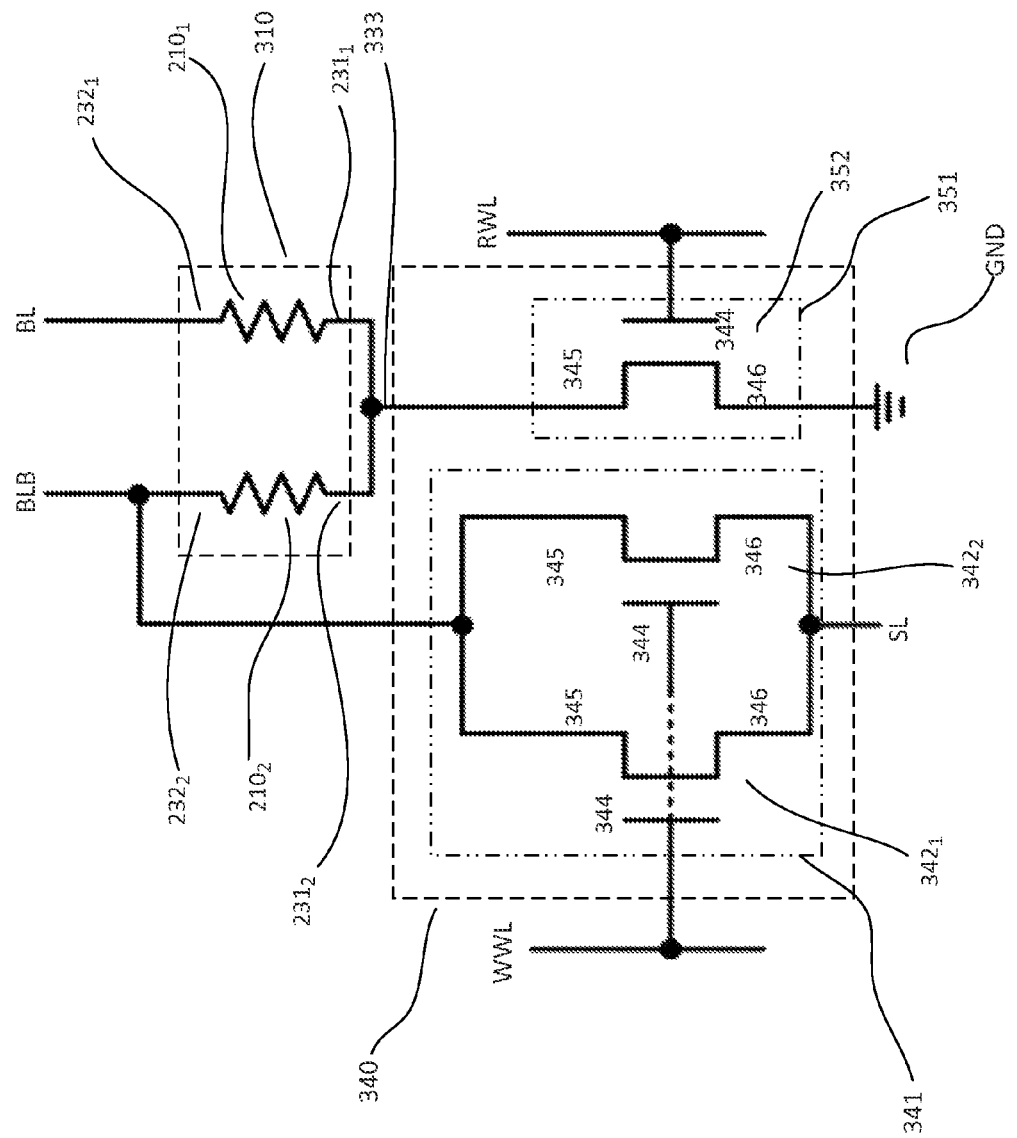
FIG. 3a shows a schematic diagram of an embodiment of a memory cell.

FIG. 3a shows a schematic diagram of an embodiment of a memory cell 303. The memory cell is a non-volatile memory cell. For example, the memory cell may be a magnetic memory cell. In one embodiment, the memory cell is a Spin Torque Transfer-Magnetic Random Access Memory (STT-MRAM) cell. Other suitable types of memory cells may also be useful. The memory cell includes a storage unit 310 and a cell selector unit 340. The storage unit is coupled to the cell selector unit. Storage unit 310, in one embodiment, includes first and second storage elements $210_1$ and $210_2$. The storage elements, for example, may be resistive storage elements. In one embodiment, the storage elements are magnetic resistive memory elements, such as MTJ storage elements. The MTJ elements may be such as those described in FIGS. 2a-2b. Other suitable types of MTJ or storage elements may also be useful.

First MTJ element $210_1$ includes first and second electrodes $231_1$ and $232_1$. The first electrode, for example, may be a bottom electrode while the second electrode may be a top electrode. Other configurations of electrodes may also be useful. Second MTJ element $210_2$ may similarly include a first electrode $231_2$ and a second electrode $232_2$. The first electrode, for example, may be a bottom electrode while the second electrode may be a top electrode. In one embodiment, the top electrode $232_1$ of the first MTJ element $210_1$ is electrically connected to the first bit line BL. The top electrode $232_2$ of the second MTJ element $210_2$ is electrically connected to the second bit line BLB and the first selector 341. The first bitline, for example, may be referred to as bitline true while the second bitline may be referred to as bitline complement or bitline bar. Other designations for the bitlines may also be useful. The bottom electrode $231_1$ of the first MTJ element $210_1$ and the bottom electrode $231_2$ of the second MTJ element $210_2$ are electrically connected to each other at a common node 333.

Cell selector unit 340 includes first and second selectors or selector subunits 341 and 351. The first selector 341, for example, may be a write channel selector and the second selector 351 is a read channel selector. The write channel selector selectively couples the write channel to the storage unit; the read channel selector selectively couples the read channel to the storage unit. A write wordline WWL is coupled to a write control terminal of the write channel selector for selectively coupling the write channel to the storage unit while a read wordline RWL is coupled to a read control terminal of the read channel selector for selectively coupling the read channel to the storage unit.

The selectors, in one embodiment, include transistors, such as metal oxide semiconductor transistors. A select transistor, as shown, includes first and second source/drain (S/D) terminals 345 and 346 and a gate or control terminal 344. Other types of selectors may also be useful.

In one embodiment, the read channel selector includes a read transistor 352. The read transistor includes a first S/D terminal coupled to the storage unit via node 333, a second S/D terminal is coupled to ground (GND) and a gate terminal is coupled to the RWL. An active signal at the RWL connects the read path to the storage element. On the other hand, an inactive signal at the RWL decouples the read path from the storage element. The active signal, for example, is a logic "1" signal and the inactive signal is a logic "0" signal. Other configurations of active signals may also be useful.

As for the write selector, in one embodiment, it includes first and second write transistors $342_1$ and $342_2$ coupled in parallel. For example, the first S/D terminals are commonly coupled and the second S/D terminals are commonly coupled. The first S/D terminals are commonly coupled to, in one embodiment, the first electrode of the second storage element of the storage unit. For example, the first S/D terminals are coupled to the first electrode of the second storage element and second bitline or BLB. The second S/D terminals are commonly coupled to a source line SL. The gates of the write transistors are commonly coupled to a WWL. An active signal at the WWL connects the write path to the storage element. On the other hand, an inactive signal at the WWL decouples the write path from the storage element. The active signal, for example, is a logic "1" signal and the inactive signal is a logic "0" signal. Other configurations of active signals may also be useful. Providing two write transistors increases drive current to increase write speed. Providing other numbers of write transistors for the write selector may also be useful, including 1. The amount of transistors, for example, may depend on the desired drive current for write operations, the desired write time and cell size.

Figure 3B:
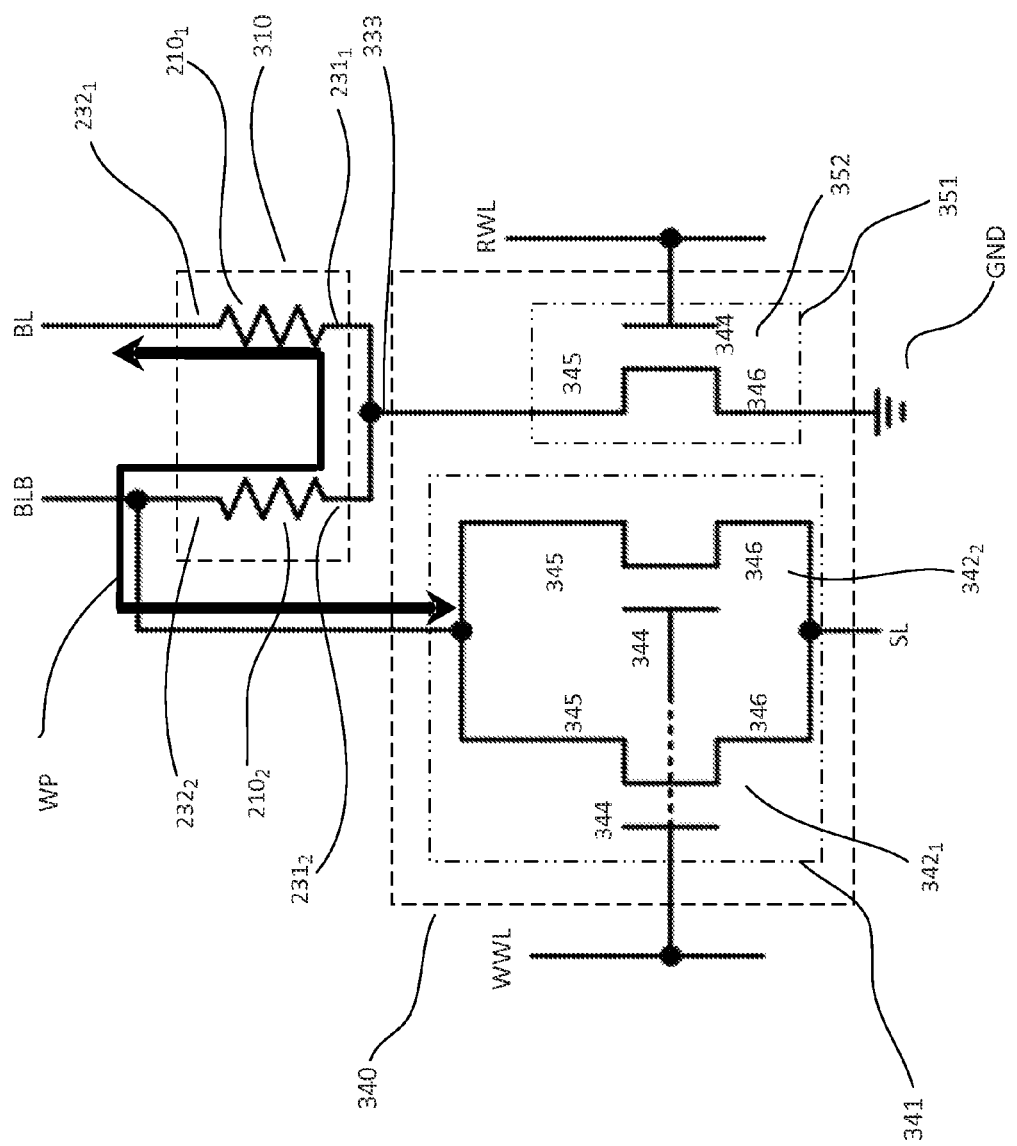
FIGS. 3b-3c illustrate write and read operations of an embodiment of a memory cell.

FIG. 3b shows a write operation of an embodiment of a memory cell 303. The memory cell, for example, is a memory cell as described in FIG. 3a. Common elements will not be described or described in detail. Appropriate signals are applied to the various terminals or line of the memory cell to effect a write operation. Table 1 below shows exemplary signals or bias conditions applied to the memory cell for write operations.

TABLE 1

| operation | signal (V) | | | | |
|---|---|---|---|---|---|
| | BL | BLB | WWL | RWL | SL |
| Write "0" | 1.1 | floating | 1.1 | 0 | 0 |
| Write "1" | −1.1 | floating | 1.1 | 0 | 0 |

As shown above, for write "0" operation, the BL and SL could be 1.1V and 0V respectively, while for write "1" operation, the BL and SL could be −1.1V and 0V, respectively. The voltage values shown are exemplary and may change, depending on, for example, the technology.

A write operation is effected by coupling the write channel to the storage unit. The read channel is decoupled in such cases. This is achieved by providing an active write signal (e.g., 1.1V) at the WWL and an inactive read signal (e.g., 0V) at the RWL. As illustrated, a write path WP is formed from BL to SL by floating BLB. Depending on whether it is a write "1" operation or write "0" operation, the current flows from BL to SL or SL to BL. For example, for write "0" operation, the current flows from BL to SL while for write "1" operation, the current flows from SL to BL.

Figure 3C:
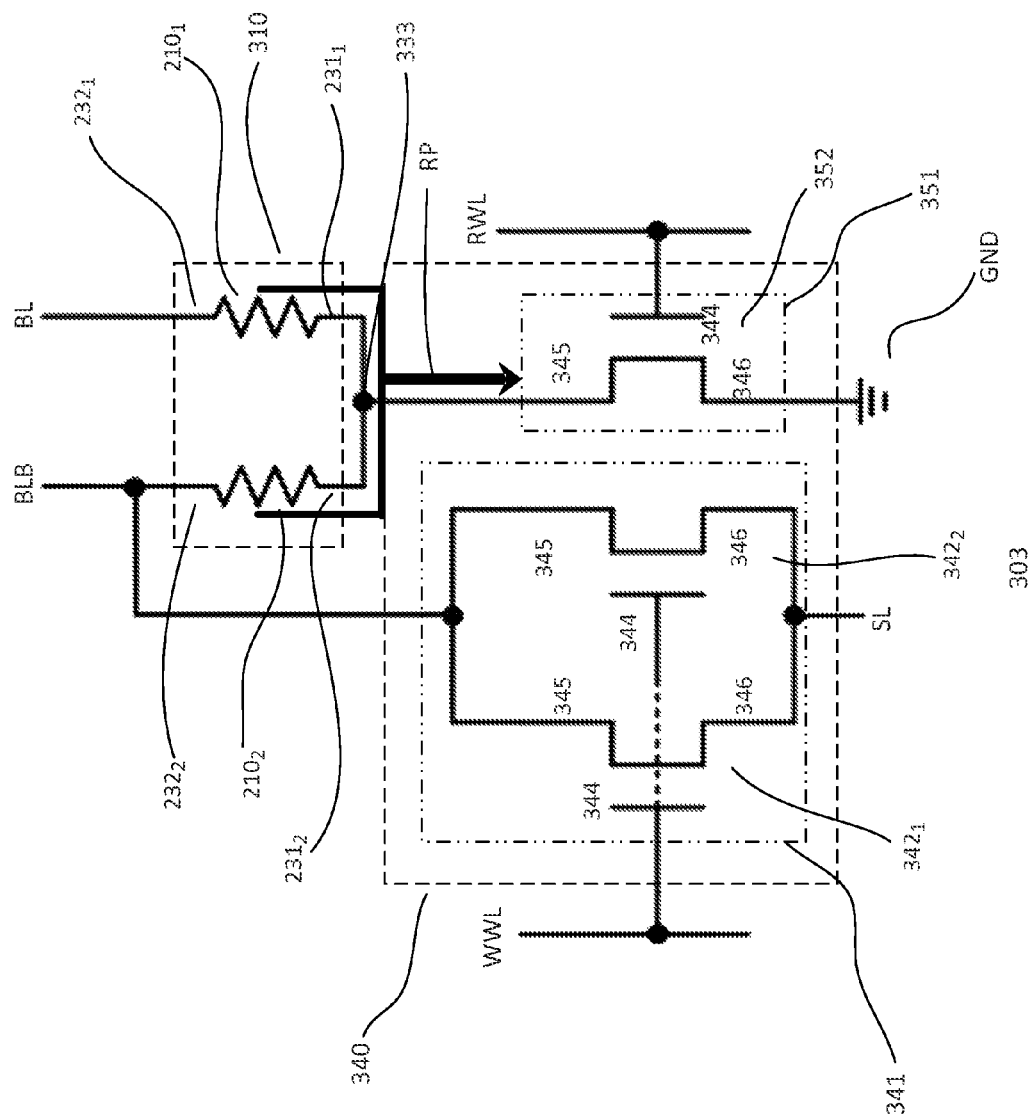

FIG. 3c shows a read operation of an embodiment of a memory cell 303. The memory cell, for example, is a memory cell as described in FIG. 3a. Common elements will not be described or described in detail. Appropriate signals are applied to the various terminals or line of the memory cell to effect a read operation. Table 2 below shows exemplary signals or bias conditions applied to the memory cell for read operations.

TABLE 2

| operation | signal (V) | | | | |
|---|---|---|---|---|---|
| | BL | BLB | WWL | RWL | SL |
| Read | 0.25 | 0.25 | 0 | 1.1 | 0 |

For Table 2 above, it is assumed that the voltage which switches the magnetization of the storage element, for example, is about 0.5V and the voltage for BL and BLB, for example, are lower than 0.5V. The voltage values shown are exemplary and may change, depending on, for example, the technology.

A read operation is effected by coupling the read channel to the storage unit. The write channel is decoupled in such cases. This is achieved by providing an active read signal (e.g., 1.1V) at the RWL and an inactive write signal (e.g., 0V) at the WWL. As illustrated, the read path RP is formed from BL and BLB to GND. The read voltage applied to BL and BLB should be less than a voltage which switches the magnetization of the storage elements.

In one embodiment, the SLs of the read and write transistors for write and read operations are configured to be applied with the same signal or bias conditions as shown in Table 1 and Table 2 above. Thus, this allows adjacent write and read transistors to share a common source terminal and the source terminals of the transistors can be coupled to the same SL. For example, the source terminals of the transistors are coupled to GND. This enables a smaller memory cell size to be achieved.

Table 3 below shows another exemplary signal or bias conditions applied to the memory cell for write operations.

TABLE 3

| operation | signal (V) | | | | |
|---|---|---|---|---|---|
| | BL | BLB | WWL | RWL | SL |
| Write "0" | 1.1 | floating | 1.1 | 0 | 0 |
| Write "1" | 0 | floating | 1.1 | 0 | 1.1 |

As shown above, for write "1" operation, the BL and SL could be 0V and 1.1V, respectively. The voltage values shown are exemplary and may change, depending on, for example, the technology. In this case, the SLs of the read and write transistors for write and read operations are configured to be applied with different signal or bias conditions as shown in Table 2 and Table 3 above. Thus, adjacent write and read transistors will have separate source terminals coupled to separate SLs.

Figure 4:
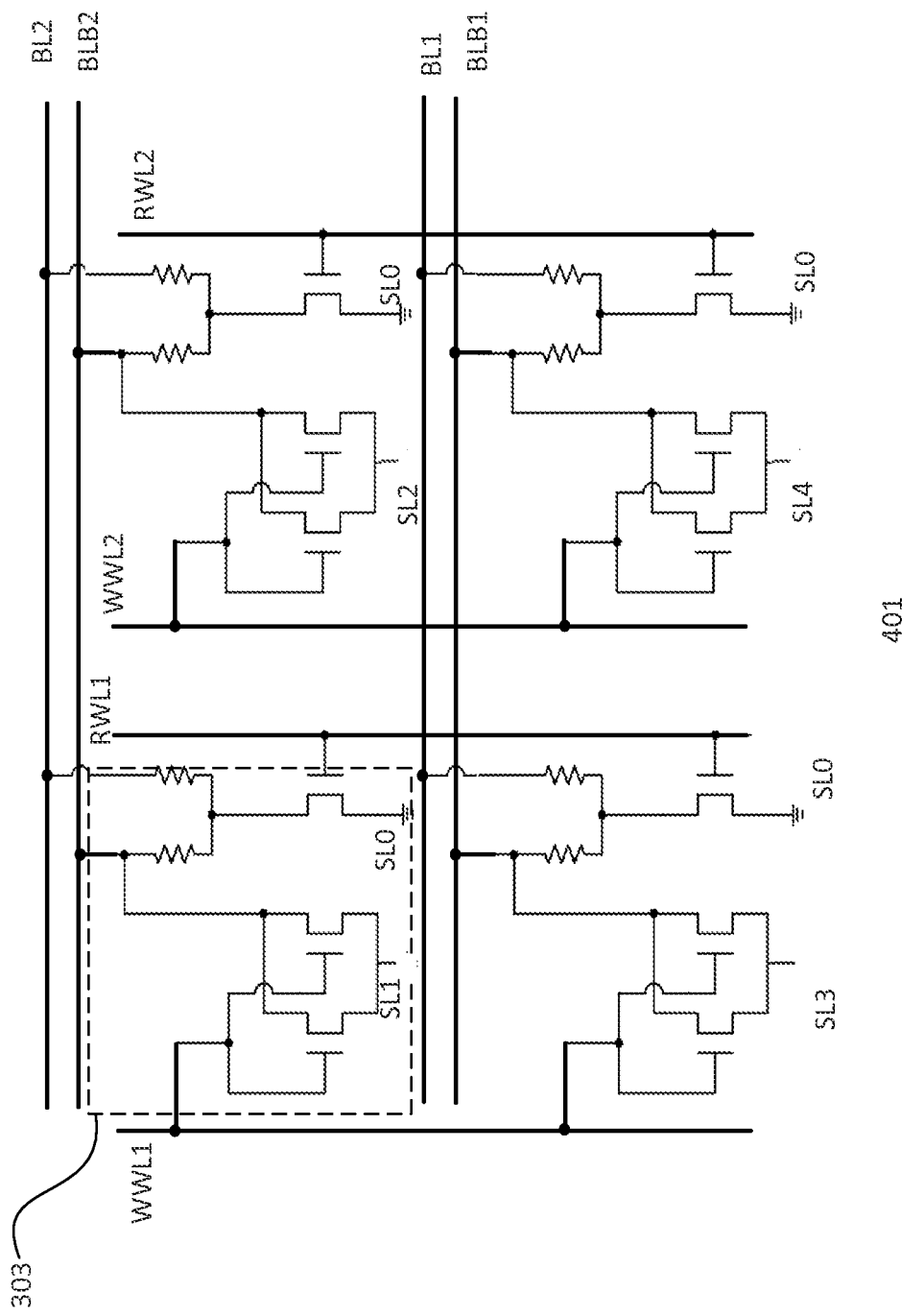
FIG. 4 shows a schematic diagram of an embodiment of a portion of a memory array.

FIG. 4 shows a schematic diagram of an embodiment of a memory array 401. The array includes a plurality of memory cells 303 interconnected. The memory cells may be similar to those described in FIGS. 3a-3c. For example, the memory cells are MRAM cells, such as STT-MRAM cells. Common elements may not be described or described in detail. Other types of cells may also be useful.

As shown, the array includes four memory cells arranged in a 2×2 array. For example, the array is arranged to form two rows and two columns of memory cells. Memory cells of a row are interconnected by first and second wordlines (WWL1, RWL1 or WWL2, RWL2) while memory cells of a column are interconnected by first and second bitlines (BL1, BLB1 or BL2 and BLB2). Referring to FIG. 4, separate SLs (SL1, SL2, SL3 and SL4) are provided for the write selectors while a common SL (SL0) is provided for the read selectors. The common SL (SL0) is coupled to GND while the other SLs (SL1, SL2, SL3 or SL4), depending on selected or non-selected memory cell, are coupled to GND or 1.1V as described previously. In one embodiment, to achieve a smaller array size, the write and read transistors share a common SL and this will make all the SLs common in the array. Although the array is illustrated as a 2×2 array, it is understood that arrays of other sizes may also be useful.

Figure 5A:
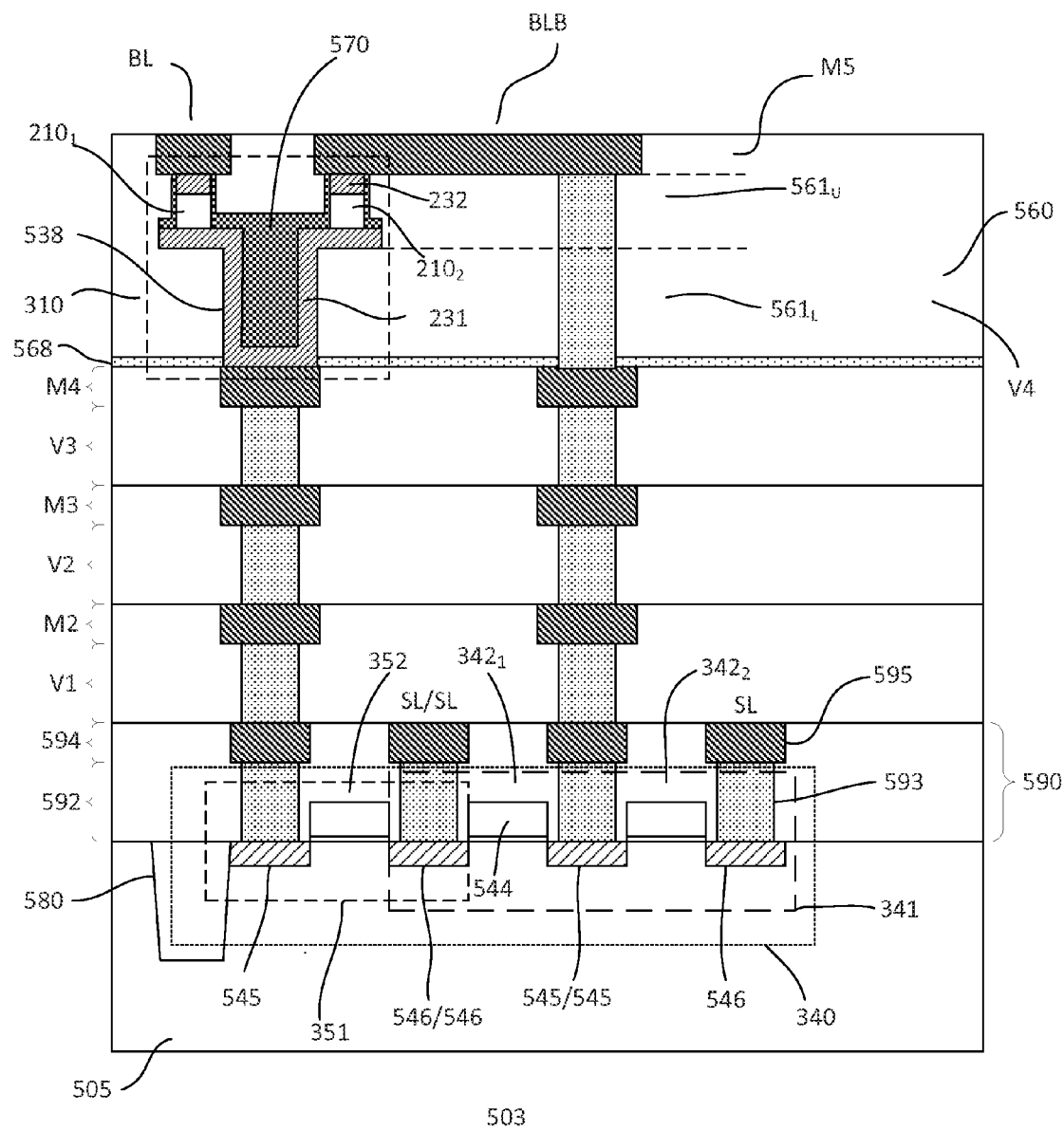
FIG. 5a shows a cross-sectional view of an embodiment of a memory cell.

FIG. 5a shows a cross-sectional view of an embodiment of a device 500. The cross-sectional view, for example is along a second or bitline direction of the device. The device, as shown, includes a memory cell 503. The memory cell, for example, may be a NVM memory cell. The memory cell, in one embodiment, is a magnetic resistive NVM cell, such as a STT-MRAM cell. The memory cell, for example, is similar to that described in FIGS. 3a-3c. Common elements may not be described or described in detail.

The memory cell is disposed on a substrate 505. For example, the memory cell is disposed in a cell region of the substrate. The cell region may be part of an array region. For example, the array region may include a plurality of cell regions. The substrate may include other types of device regions, such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Isolation regions 580 may be provided. In one embodiment, the isolation regions are shallow trench isolation (STI) region. Other types of isolation regions may also be useful. The isolation regions are provided to isolate device regions from other regions. In one embodiment, isolation regions may be provided to isolate columns of memory cells. Isolation regions may be provided to isolate different memory array banks. Other suitable configurations of isolation regions may also be useful.

The cell region may include a cell device well (not shown). The cell device well, for example, serves as a body well for transistors of the memory cell. The device well may be doped with second polarity type dopants for first polarity type transistors. The device well may be lightly or intermediately doped with second polarity type dopants. For example, the device well may have a dopant concentration of about 1E10-1E14/cm$^2$. Other suitable dopant concentrations may also be useful. In some cases, a cell device isolation well (not shown) may be provided, encompassing the cell device well. The isolation well may have a dopant type which has the opposite polarity to that of the array well. For example, the isolation well may include first polarity type dopants. The isolation well serves to isolate the cell device well from the substrate. Well biases may be provided to bias the wells. The isolation well and the cell device well may be biased at ground or biased differently, depending on the circuit design.

The cell device well may be a common well for the cell regions in the array region. For example, the cell device well may be an array well. The cell device well may serve as array isolation well. Other configurations of device and isolation wells may also be useful. Other device regions of the device may also include device and/or device isolation wells.

A cell selector unit 340 is provided in the cell region. The cell selector unit includes first and second selectors or selector subunits 341 and 351. The first selector, for example, may be a write channel selector and the second selector is a read channel selector. The selectors may include transistors. For example, the transistors of the selectors are MOS transistors. The MOS transistors may be planar MOS transistors. Other types of MOS transistors, such as fin type MOS transistors may also be useful. Other types of cell selectors, such as BJT or diodes, may also be useful.

A transistor, as shown, includes first and second source/drain (S/D) regions 545 and 546 formed in the substrate and a gate 544 disposed on the substrate between the S/D regions. The gate, for example, may include a gate electrode over a gate dielectric. The gate electrode may be polysilicon while the gate dielectric may be silicon oxide. Other suitable types of gate electrode and gate dielectric materials may also be useful. A gate, for example, may be a gate conductor along a first or wordline direction. The gate conductor forms a common gate for a row of memory cells.

As for the S/D regions, they are heavily doped regions with first polarity type dopants. For example, the S/D regions are heavily doped n-type regions for forming n-type transistor. Providing S/D regions with p-type dopants may also be useful. The S/D regions may include lightly doped (LD) regions. The gate may include dielectric sidewall spacers (not shown). The spacers, for example, facilitate forming the LD and S/D regions.

In one embodiment, the read channel selector includes a read select transistor 352. As for the write selector, in one embodiment, it includes first and second write select transistors $342_1$ and $342_2$. The select transistors include a first S/D region, a second S/D region, and a gate. The select transistors are disposed in the cell region. In one embodiment, the select transistors may be disposed on the substrate in series, with adjacent transistors sharing a common S/D region. For example, adjacent transistor's second S/D regions form a common second S/D region and adjacent transistor's first S/D regions form a common first S/D region. As shown, second S/D regions of the read select transistor and first write select transistor form a common second S/D region while first S/D regions of the write select transistors form a common first S/D region. By providing common S/D regions and a common S/L for write and read select transistors, a smaller array size can be achieved, resulting in efficient layout of the transistors. In another embodiment, adjacent transistor's second S/D regions may be separate and are coupled to separate SLs (not shown). Other suitable configurations of transistors may also be useful.

As described, the write channel selector includes two transistors. Providing two write transistors increases drive current to increase write speed. Providing other numbers of write transistors for the write selector may also be useful, including 1 or more than 2. The amount of transistors, for example, may depend on the desired drive current for write operations, desired write time and cell size.

A first dielectric layer 590 is disposed over the substrate. The dielectric layer, for example, may be an interlevel dielectric (ILD) layer. An ILD layer includes a metal level 594 and a contact level 592. The metal level 594 includes conductors or metal lines 595 while the contact level 592 includes contacts 593. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE), may also be employed to form metal lines.

A device may include a plurality of ILD levels. For example, x number of ILD levels may be provided. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. For the first contact level, it may be referred to as CA level.

In one embodiment, the first dielectric layer correlates to the first ILD level. For example, the contact level is a pre-metal dielectric (PMD) or contact (CA) level and the metal level is M1. Contacts in the PMD level may be tungsten contacts while conductors in M1 may be copper or copper alloy.

As shown, additional ILD levels are provided above M1. As shown, four additional ILD levels are provided over M1. For example, V1 and M2, V2 and M3, V3 and M4 and V4 and M5 may be disposed above M1. Other levels may also be provided. As for the upper ILD levels, contacts and conductors may be copper or copper alloy. Other types of conductive materials, such as aluminum, may also be useful to form contacts and conductors. Other configurations of the contacts and conductors may also be useful. Via levels may be configured to have upper and lower via levels or just one via level. Other configurations of via levels may also be useful.

A dielectric liner (not shown) may be disposed between ILD levels. The dielectric liner, for example, serves as an etch stop layer. The dielectric liner may be formed of a low k dielectric. For example, the dielectric liner may be nBLOK. Other types of dielectric materials for the dielectric liner may also be useful.

As shown, S/D contacts are disposed in the CA level. The S/D contacts are coupled to the S/D regions of the select transistors. Gate contacts (not shown) may also be provided in the contact level and are coupled to the gates of the select transistors. The gate contacts may be disposed in another cross-section of the device. The contacts may be tungsten contacts. Other types of contacts may also be useful. Metal lines are provided in M1. The metal lines are coupled to the S/D contacts. In one embodiment, SLs are coupled to the second S/D regions of the select transistors. The SLs, in one embodiment, are common SL and coupled to, for example, GND. As for the first S/D contacts, they are coupled to contact pads or islands in M1. The contact pads provide connections to upper ILD levels. The metal lines or pads may be formed of copper or copper alloy. Other types of conductive material may also be useful.

A storage unit 310 is disposed in a cell dielectric layer 560. The cell dielectric layer may be disposed above the first dielectric layer or first ILD layer. The cell dielectric layer is part of an ILD layer above M1. In one embodiment, the cell dielectric layer also serves the via level of an ILD layer above M1. For illustration purpose, the cell dielectric layer, for example, is the via level V4 of the ILD layer. Providing the cell dielectric layer as part of other ILD layers may also be useful, depending on the metal routing design. The cell dielectric layer may be formed of silicon oxide. Other types of dielectric materials may also be useful for the cell dielectric layer. The cell dielectric layer may be of the same material as the contact level of an ILD layer. Providing a cell dielectric layer having different dielectric materials than the contact levels may also be useful. The cell dielectric layer, for example, may be referred to as part of the contact level and vice-versa. Other configurations of cell dielectric layers may also be useful.

A dielectric liner 568 may be disposed between lower ILD level and cell dielectric layer. The dielectric liner, for example, serves as an etch stop layer. The dielectric liner may be formed of a low k dielectric. For example, the dielectric liner may be nBLOK. Other types of dielectric materials for the dielectric liner may also be useful.

The storage unit includes first and second storage stacks or elements $210_1$-$210_2$ having various layers. The storage stacks may be magnetic storage stacks. The magnetic storage stacks, for example, are MTJ stacks similar to those described in FIGS. 2a-2b. Common elements may not be described or described in detail. The MTJ stack may include various layers configured as a top-pinned or bottom pinned MTJ stacks. The MTJ stacks form a MRAM cell. Other types or configurations of storage stacks may also may useful. First and second storage plugs are disposed between bottom and top electrodes.

In one embodiment, one of the electrodes of the storage stacks is a common electrode while the other electrode is distinct. For example, as shown, the bottom electrode of the storage stacks is a common electrode 231 while the top electrode is a distinct electrode 232. The various layers of the storage plug and top electrode, for example may be of the same dimension.

In one embodiment, the cell dielectric layer includes lower and upper cell dielectric layers $561_L$ and $561_U$. As discussed, the upper and lower cell dielectric layers may be formed of silicon oxide. For example, the upper and lower cell dielectric layers may be formed of the same type of dielectric material. Forming upper and lower cell dielectric layers with different materials may also be useful. A cell trench 538 is provided in the lower cell dielectric layer. The cell trench extends through the dielectric liner. For example, the cell trench exposes the underlying ILD layer, such as M4. The common bottom electrode lines the cell trench and top of the lower cell dielectric layer adjacent to the trench. In one embodiment, the bottom electrode lines the cell trench without filling it, forming a bottom electrode trench. The bottom electrode should extend over the top of the lower cell dielectric layer sufficiently to accommodate the storage plugs. The cell trench, for example, serves to connect the bottom electrode to the underlying metal line, such as M4. The top electrodes extend to the top surface of the upper cell dielectric layer. The thickness of the upper and lower cell dielectric layers should be sufficient to accommodate the thickness of the storage stack. For example, the thickness of the upper cell dielectric layer may be about 100-200 nm. The thickness of the lower cell dielectric layer, for example, may be about 50-150 nm. Other suitable thicknesses for the upper and lower cell dielectric layers may also be useful.

A passivation layer 570 is provided to protect the storage stacks. In one embodiment, the passivation layer lines sides of the storage stacks and fills the bottom electrode trench. In one embodiment, the passivation layer is SiN layer. Other suitable dielectric material may also be used as the passivation layer. The upper cell dielectric layer covers the storage unit. For example, the upper cell dielectric layer fills the gaps between the storage stacks, forming a planar top surface.

Above the upper cell dielectric layer is a metal layer of an ILD level. For example, the metal layer is M5. Other metal layers may also be useful. The upper cell dielectric layer and metal layer form a planar interface. The metal layer includes metal lines disposed in a dielectric layer. The metal line and top of the dielectric layer have coplanar top surfaces. In one embodiment, a first bitline (BL) is coupled to the top electrode of the first storage stack and a second bitline (BLB) is coupled to the top electrode of the second storage stack.

As shown, the bottom electrode is coupled to contact pads and via contacts in intermediate ILD levels, coupling it to the first S/D region of the first read select transistor. As for the second bitline or BLB, it is coupled to the first S/D regions of the write select transistors by a contact in the upper and lower contact level of the cell dielectric layer and contact pads and via contacts in intermediate ILD levels. The lines and contacts on the cell dielectric layer as well as contact pads and via contacts in ILD levels below except for the first ILD level may be formed of copper or copper alloy by dual damascene technique. Other materials or techniques may also be useful to form the lines, via contacts and contact pads.

Figure 5B:
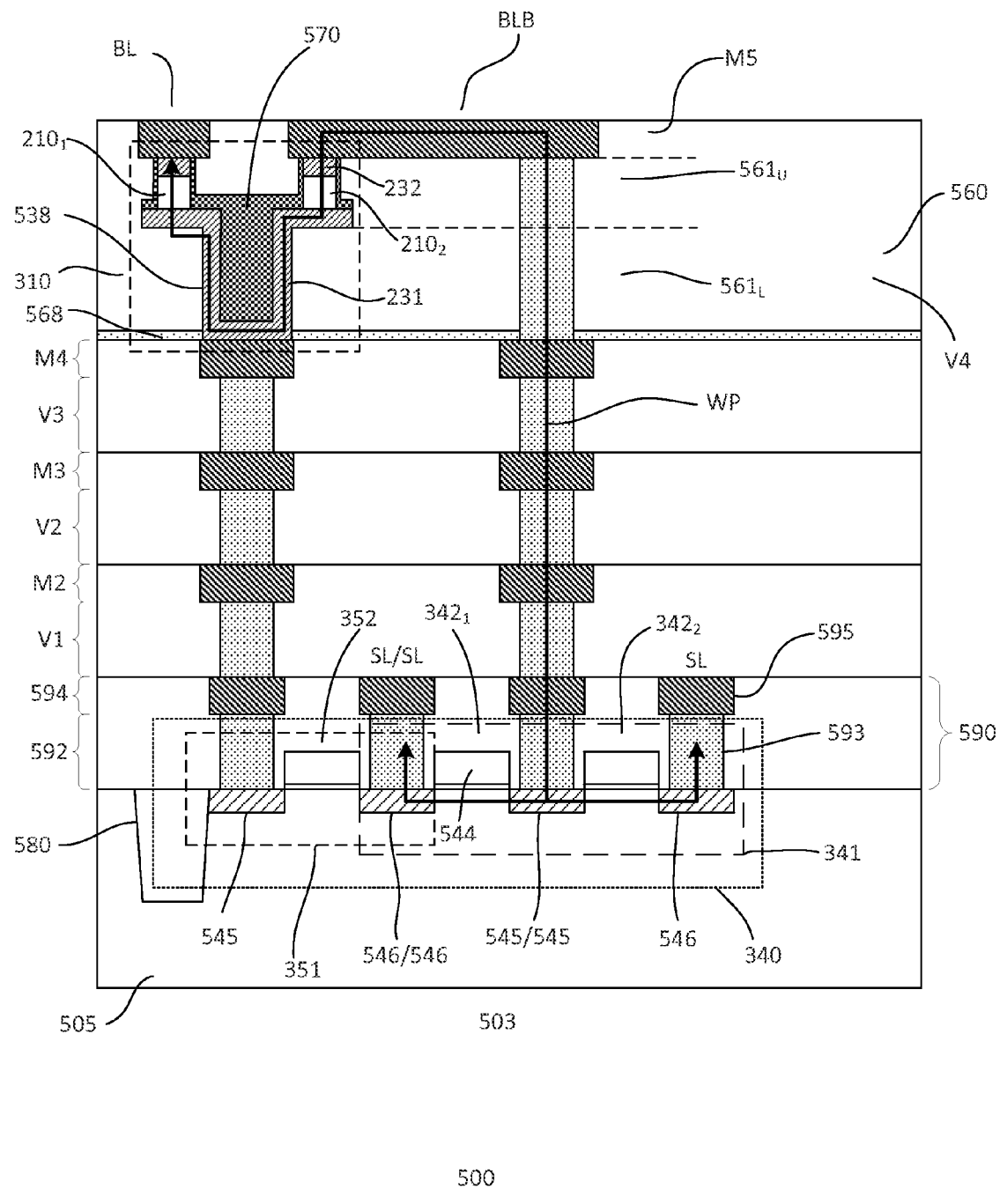
FIGS. 5b-5c show write and read paths of an embodiment of a memory cell.

FIG. 5b shows a write path of an embodiment of a memory cell 503. The memory cell is the same as that described in FIG. 5a. Common elements may not be described or described in detail. As shown, the write path WP is between BL to the SLs coupled to the write select transistors. The direction depends on whether the write is a write "1" or a write "0" operation.

Figure 5C:
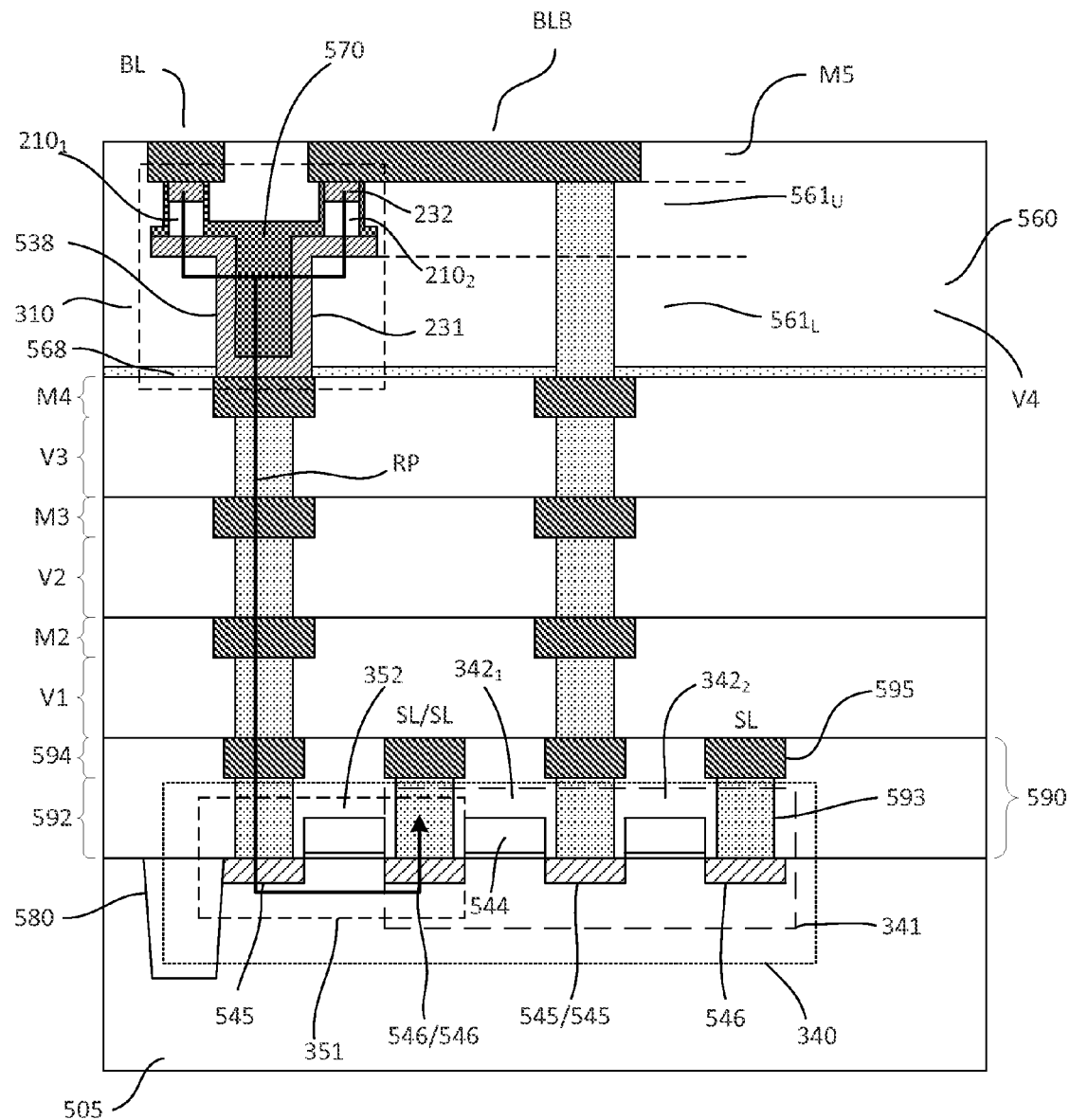

FIG. 5c shows a read path of an embodiment of a memory cell 503. The memory cell is the same as that described in FIG. 5a. Common elements may not be described or described in detail. As shown, the read path RP is between BL and BLB complement to the SL coupled to the read select transistors.

Figure 6:
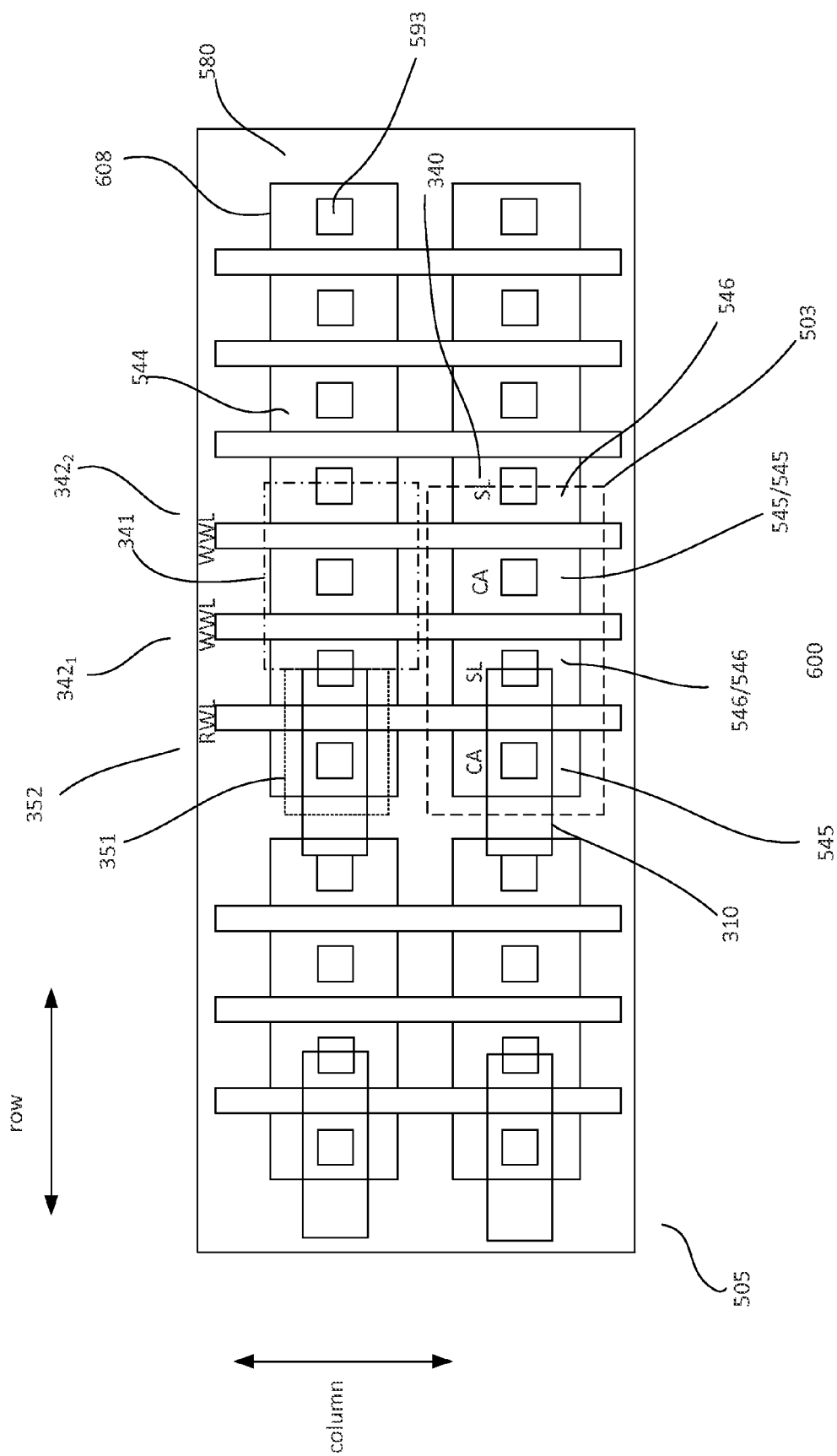
FIG. 6 shows a layout of a portion of an embodiment of a device.

FIG. 6 shows a top view of a layout of a semiconductor device 600. As shown, the layout is a portion of a device which includes a plurality of memory cells 503. The memory cells, for example, are those as described in FIGS. 5a-5c. Common elements may not be described or described in detail. The portion of the device includes a portion of a memory array. For example, the portion of the memory array includes 3×2 array of memory cells. The memory cells are arranged in rows in the row direction and columns in the column direction, as indicated by the arrows.

The layout includes active regions 608 separated by isolation regions 580. For example, the active regions are separated by shallow trench isolation regions. The active regions, for example, are cell regions. As shown, the whole row is within one active region. Active regions of a column of cells are isolated from other columns.

Transistors of a cell selector unit 340 are formed in the active cell region. The cell selector unit includes a read selector subunit 351 and a write selector subunit 341. The read selector subunit includes a read select transistor 352 while the write selector subunit includes first and second write select transistors $342_1$ and $342_2$. Other suitable number of write select transistors may also be useful. A transistor includes first and second S/D regions 545 and 546 and a gate 544. A gate, as shown, is a gate conductor along the row direction. The gate conductor forms a common gate for a row of memory cells.

In one embodiment, the select transistors of the cell selector are configured in series, with adjacent select transistors sharing a common S/D region. For example, second S/D regions of the read select transistor and first write select transistor form a common second S/D region while first S/D regions of the write select transistors form a common first S/D region. As shown, S/D contacts are coupled to the S/D regions of the select transistors. Gate contacts (not shown) are provided to couple to the gates of the transistors. The contacts are disposed in, for example, CA level. In another embodiment, the second S/D region of the read select transistor and the first write select transistor are separate (not shown) and coupled to different SLs (not shown). Other configurations may also be useful.

Figure 7A:
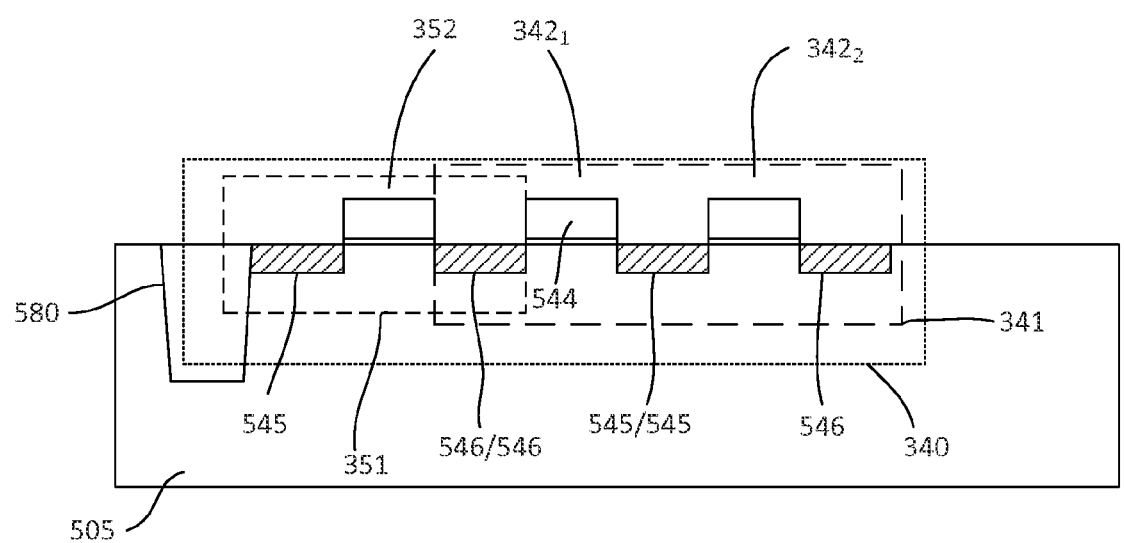
FIGS. 7a-7q show cross-sectional views of an embodiment of a process of forming a semiconductor device.
Figure 7B:
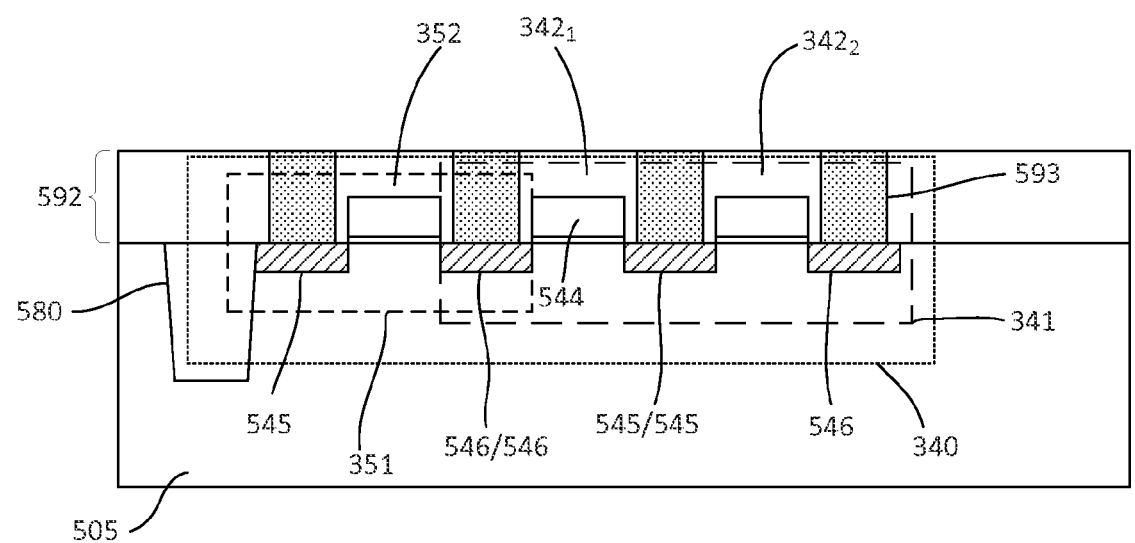
Figure 7C:
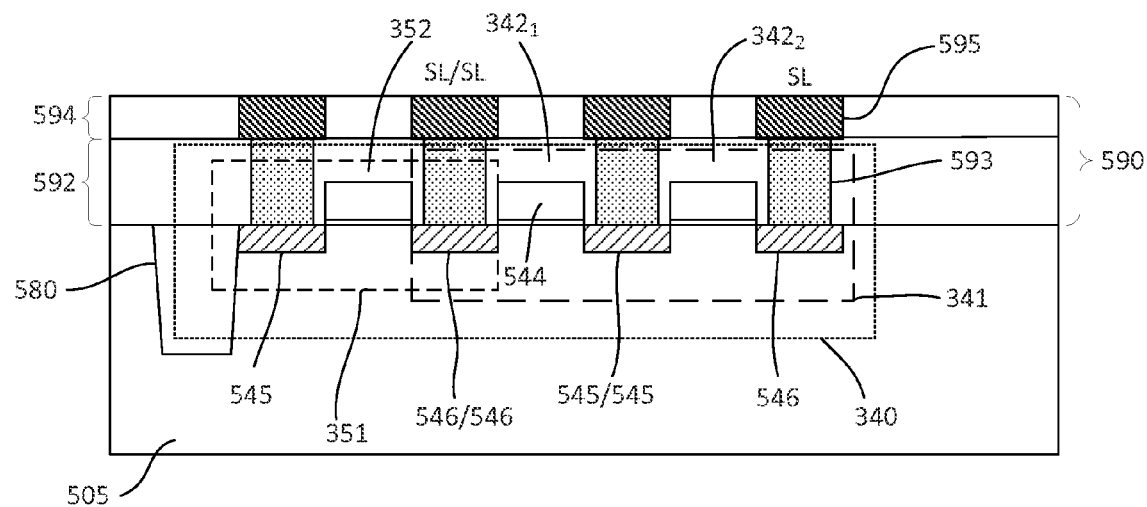
Figure 7D:
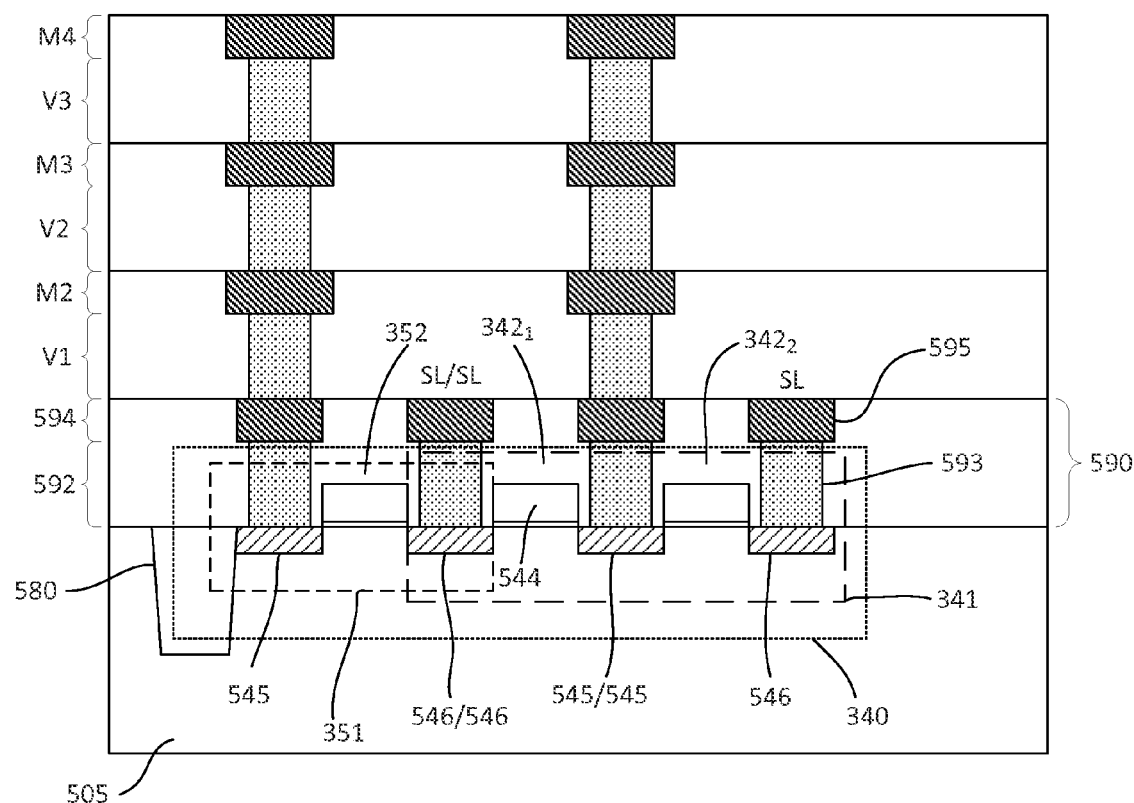
Figure 7E:
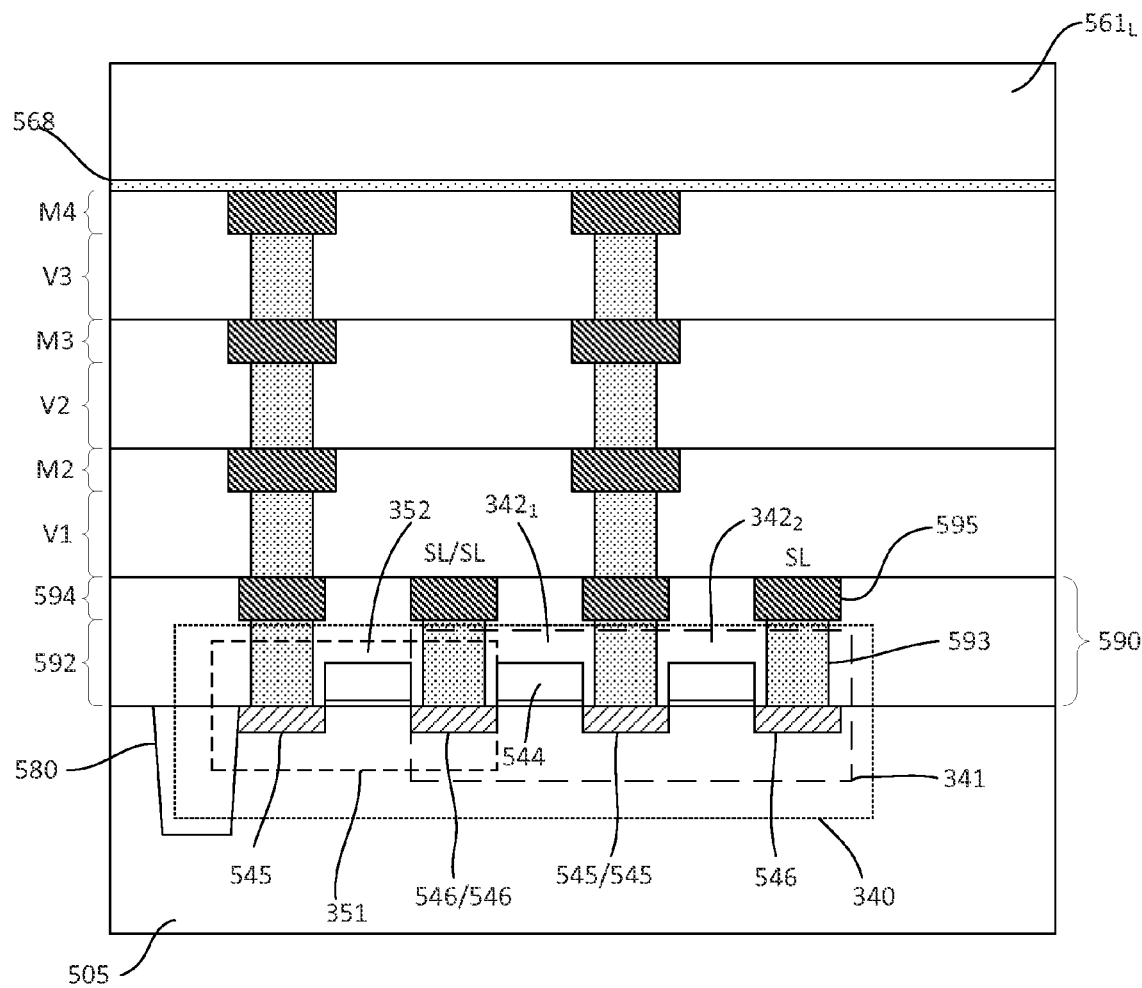
Figure 7F:
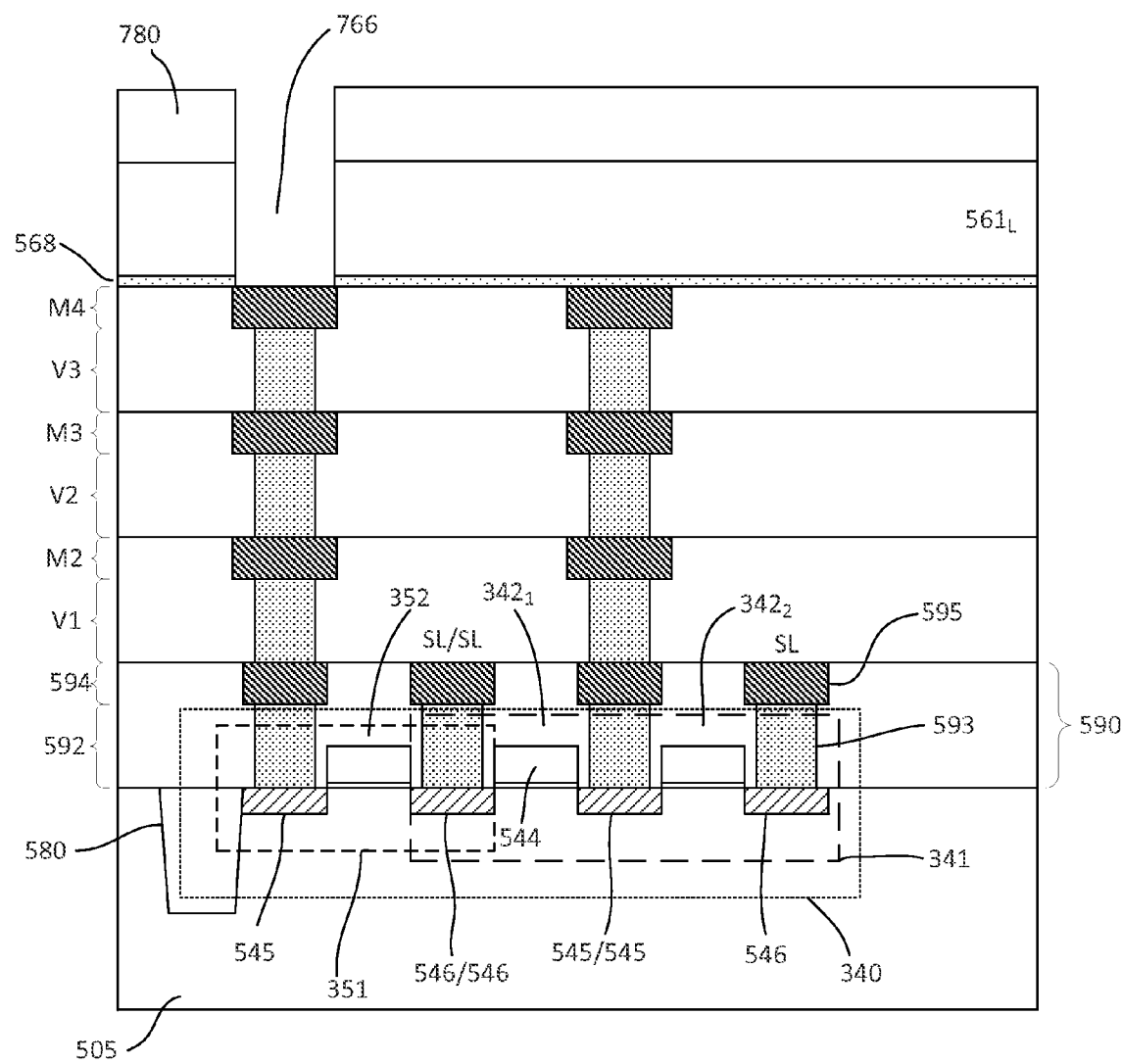
Figure 7G:
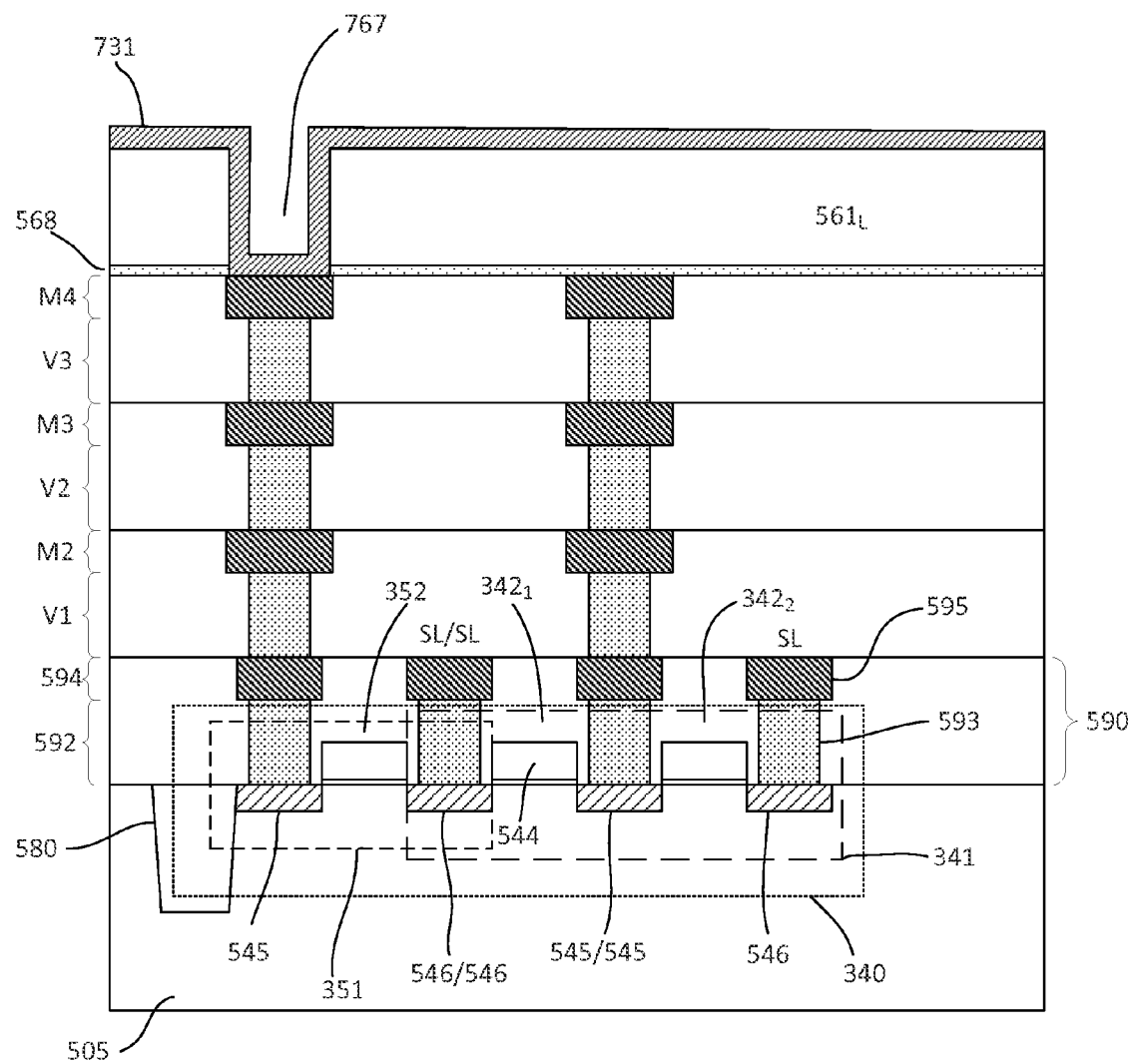
Figure 7H:
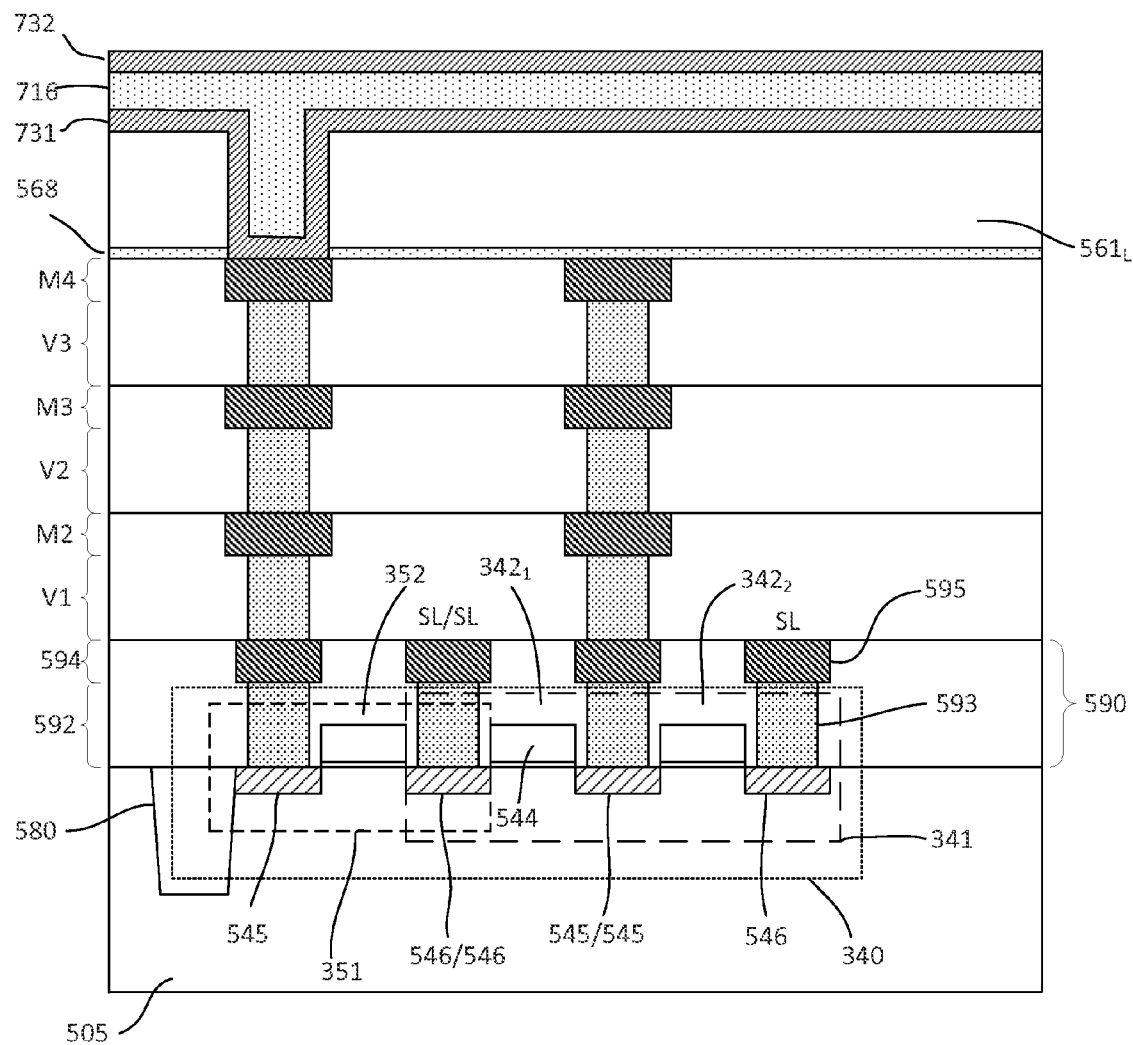
Figure 7I:
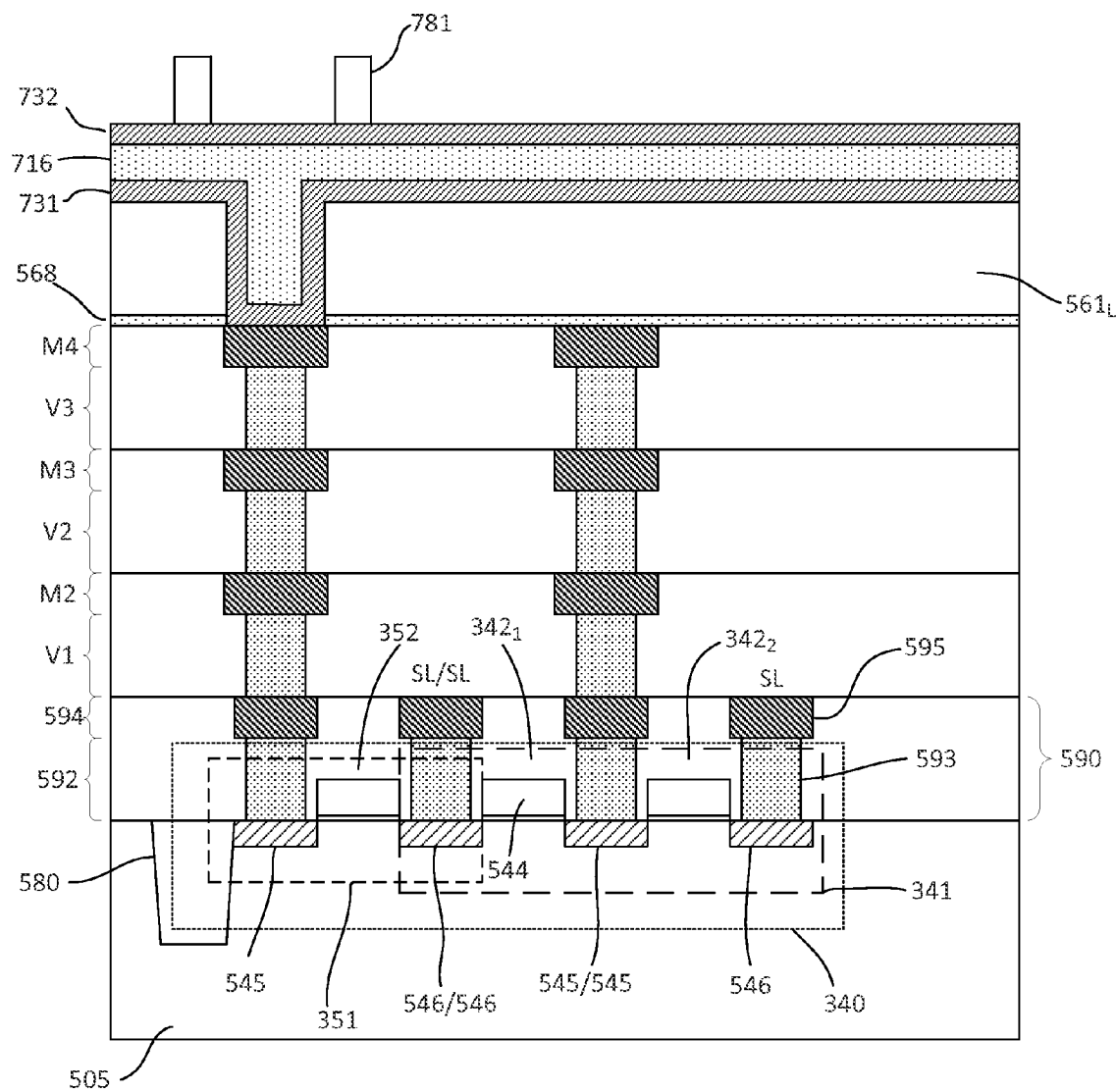
Figure 7J:
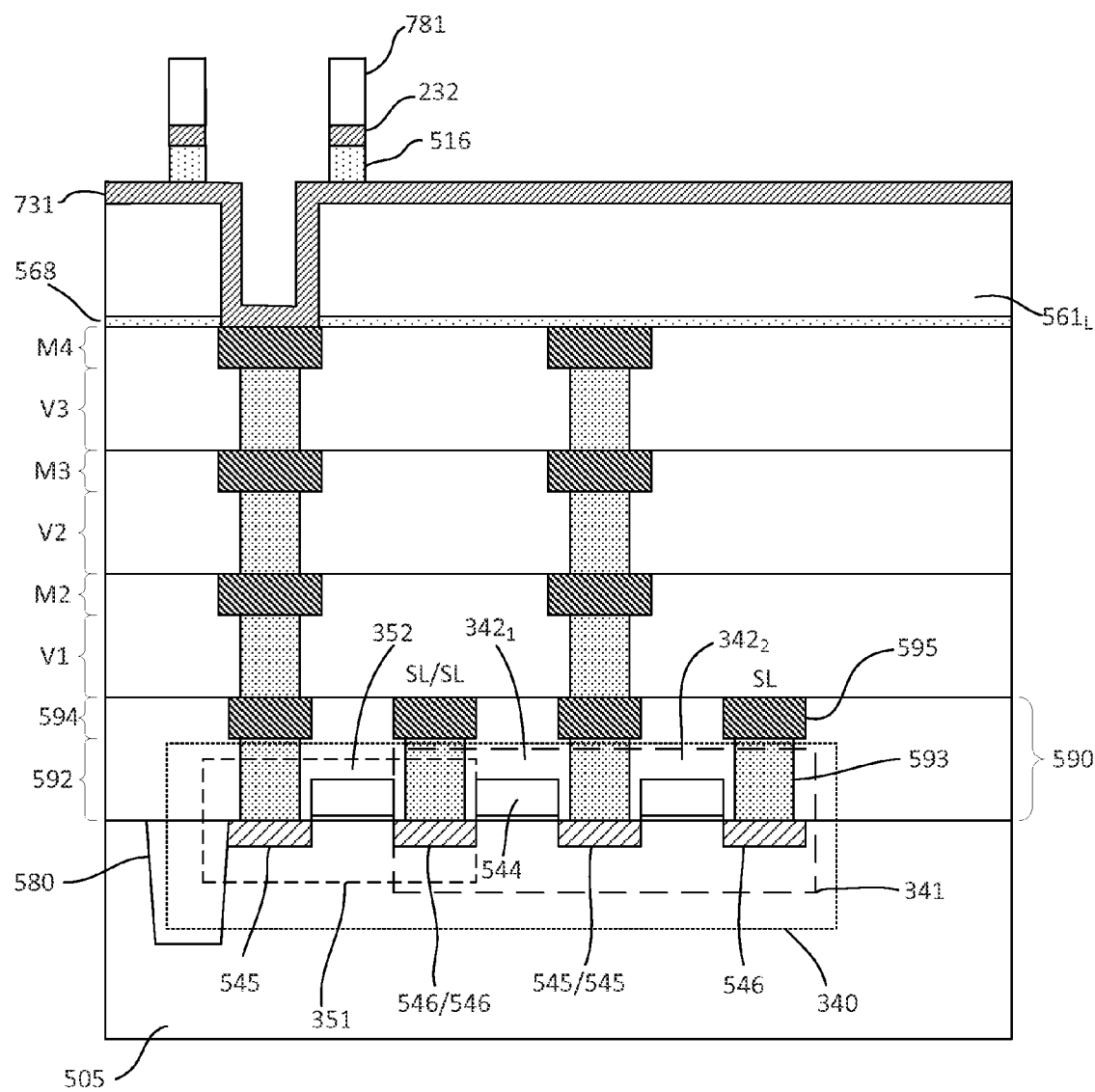
Figure 7K:
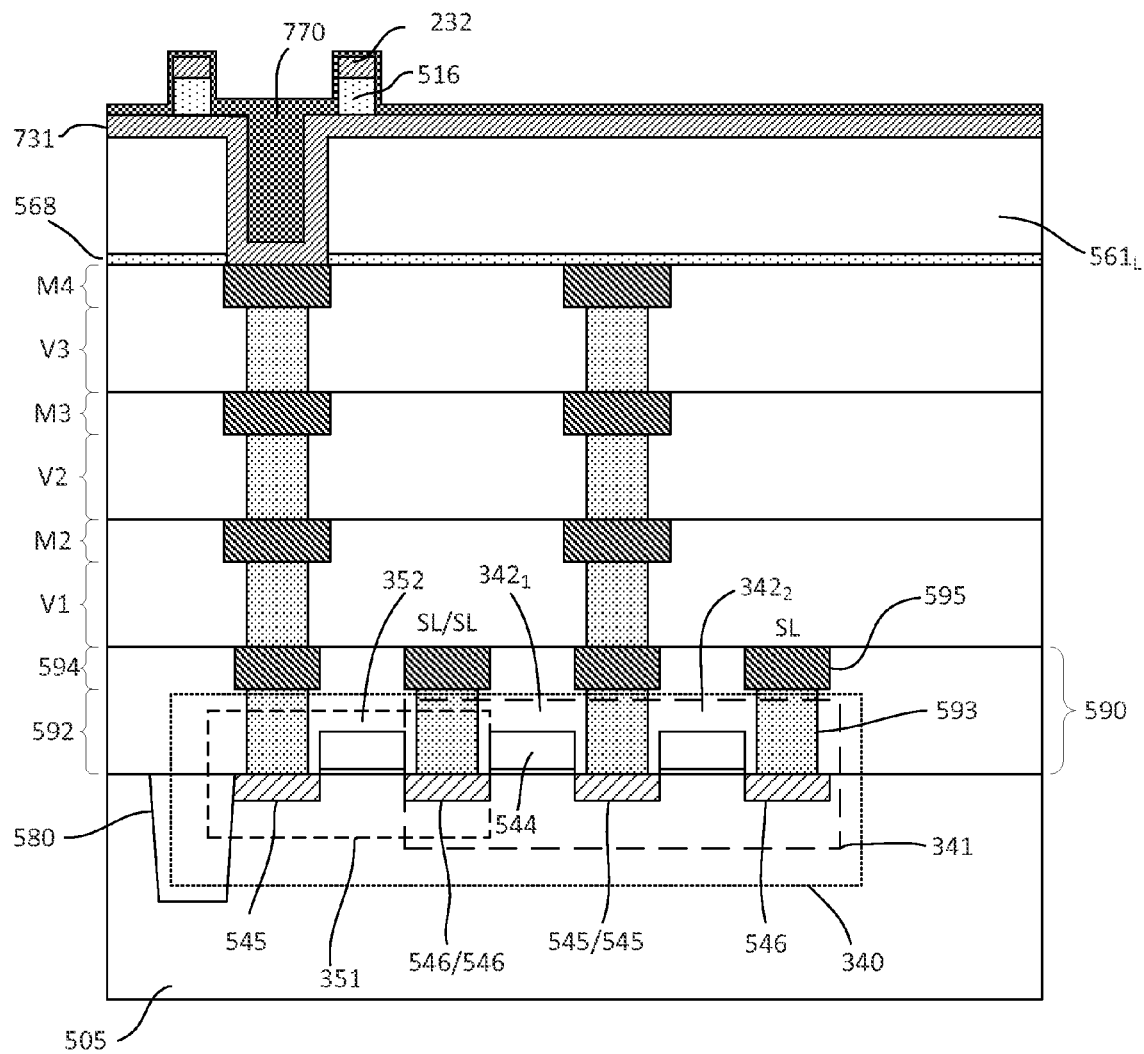
Figure 7I:
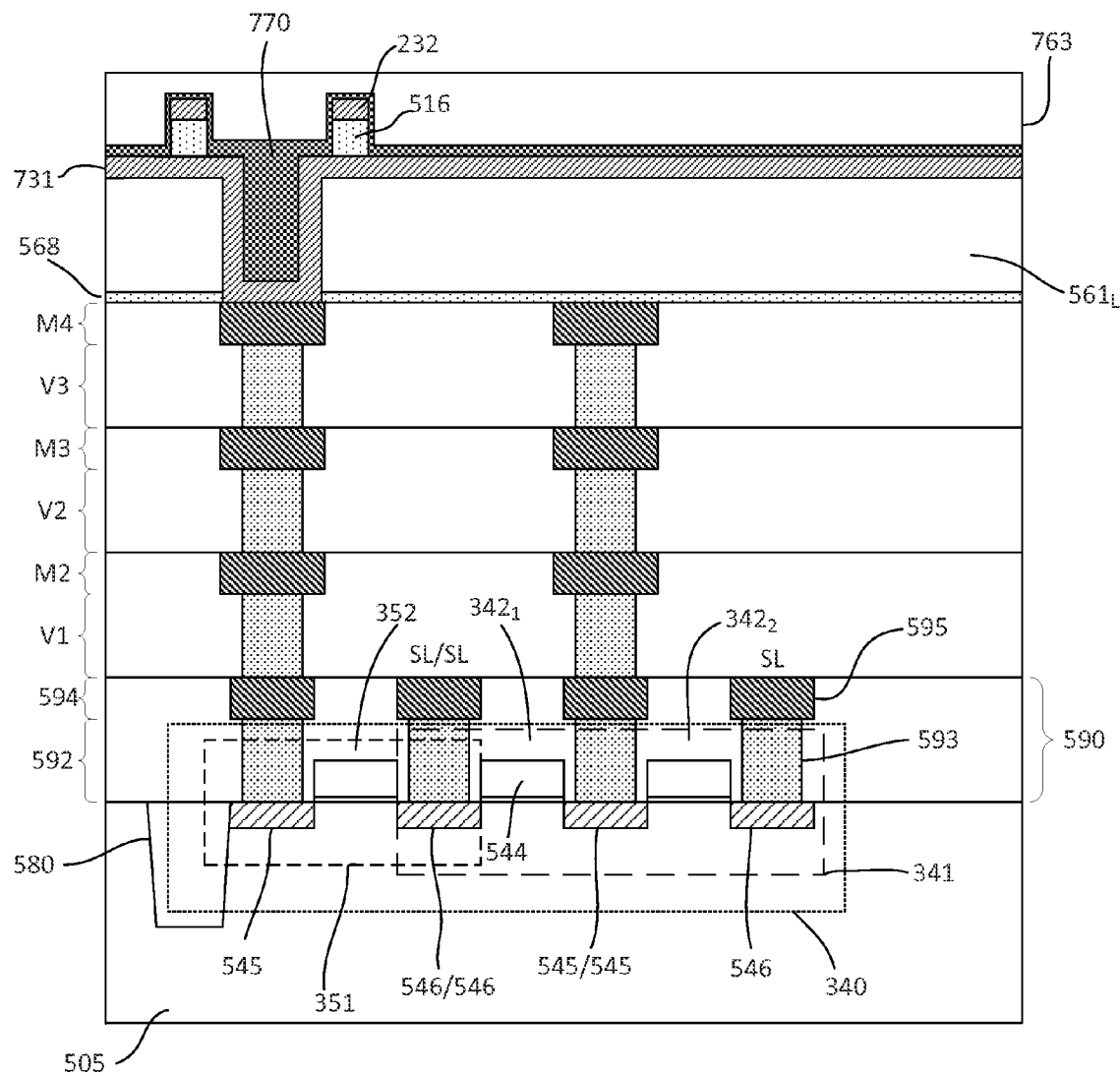
Figure 7M:
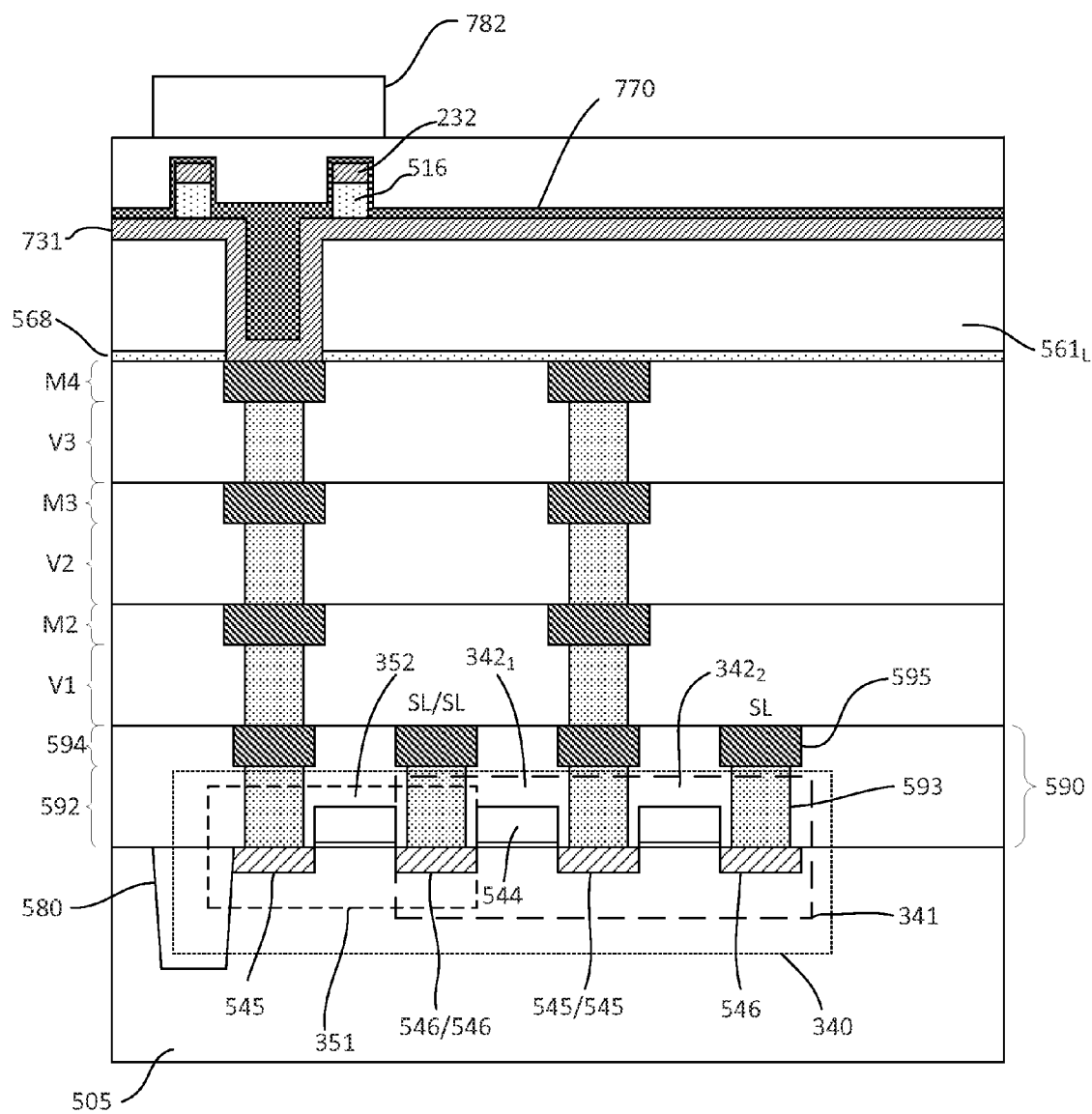
Figure 7N:
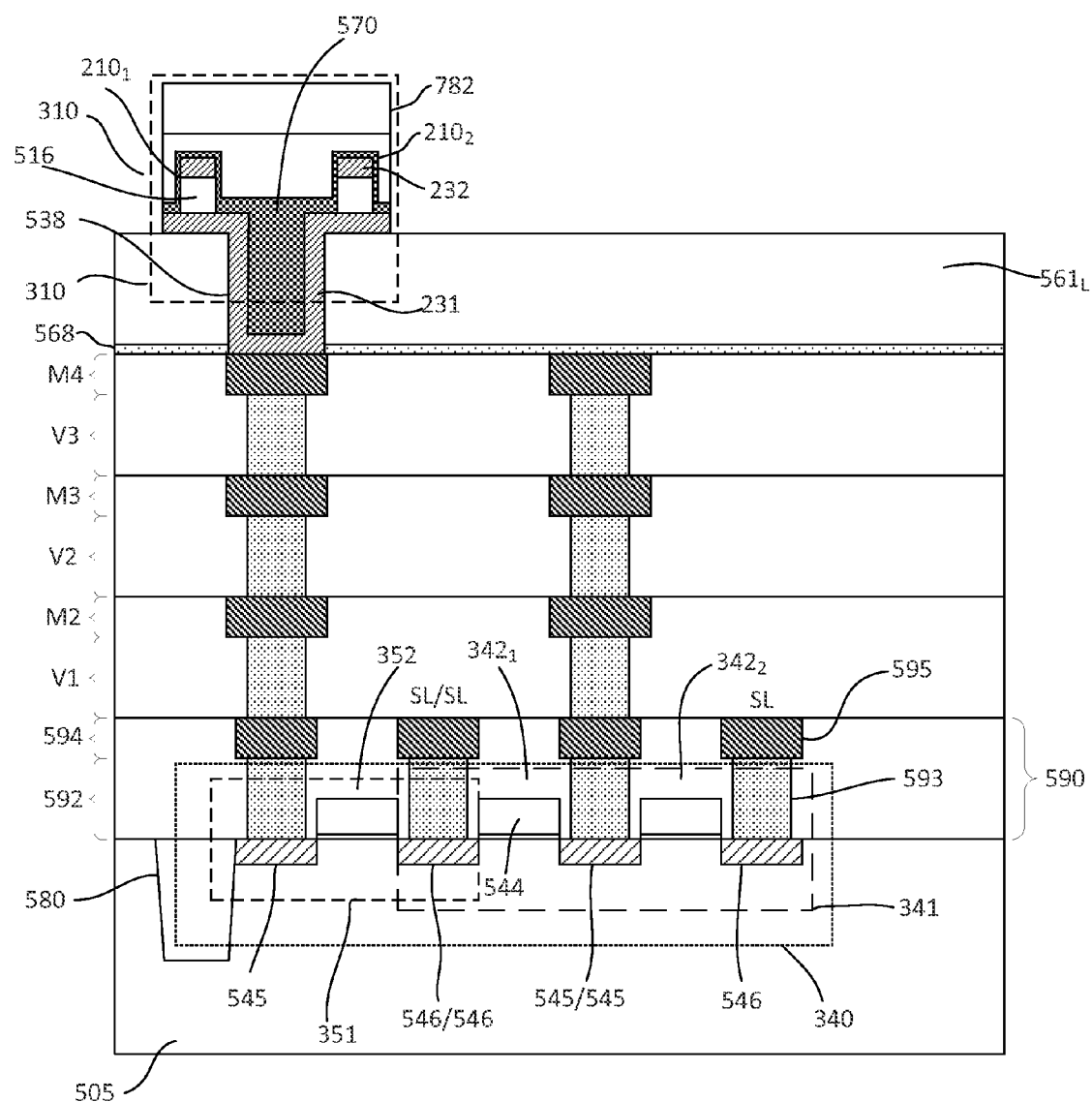
Figure 7O:
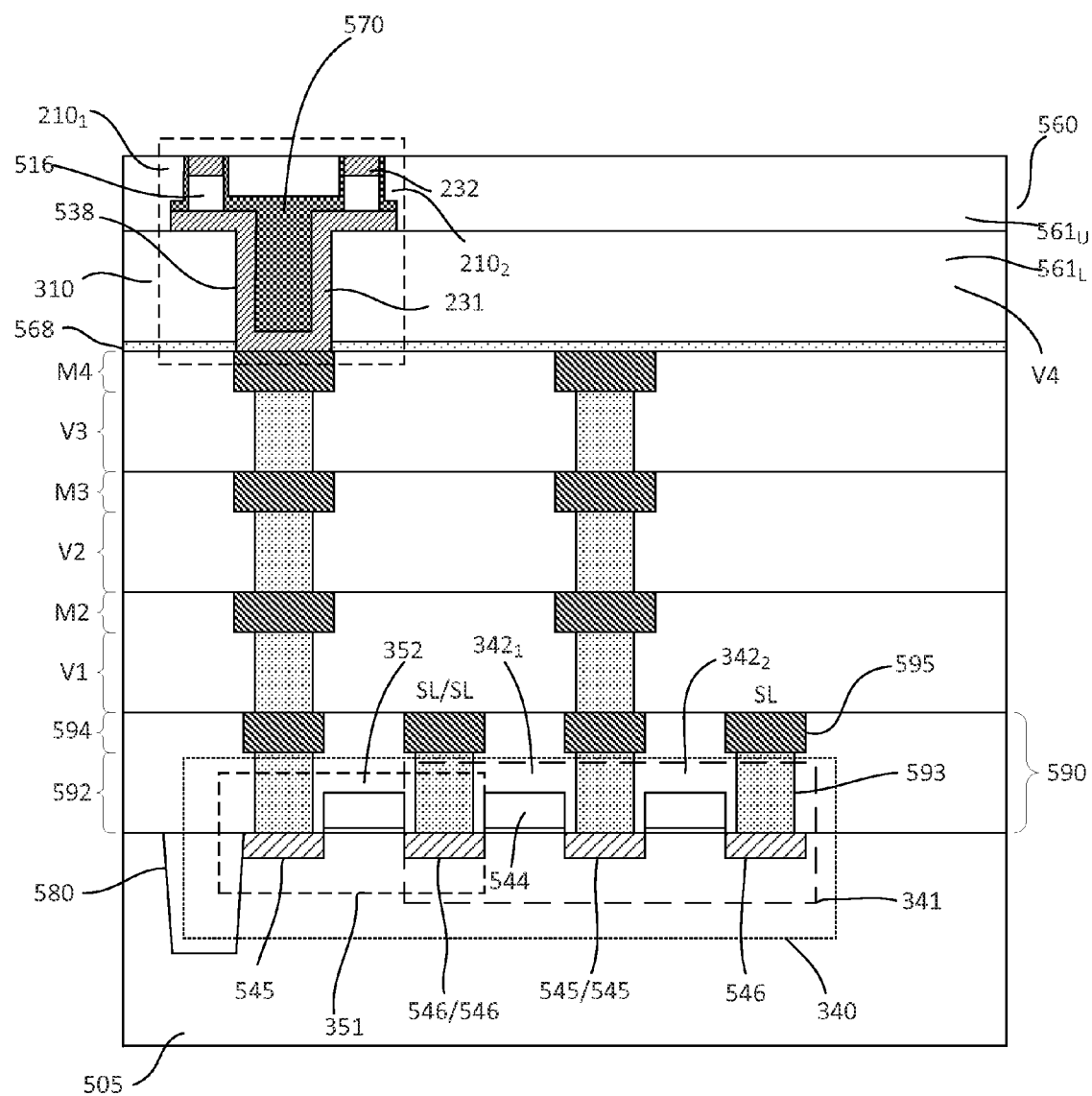
Figure 7P:
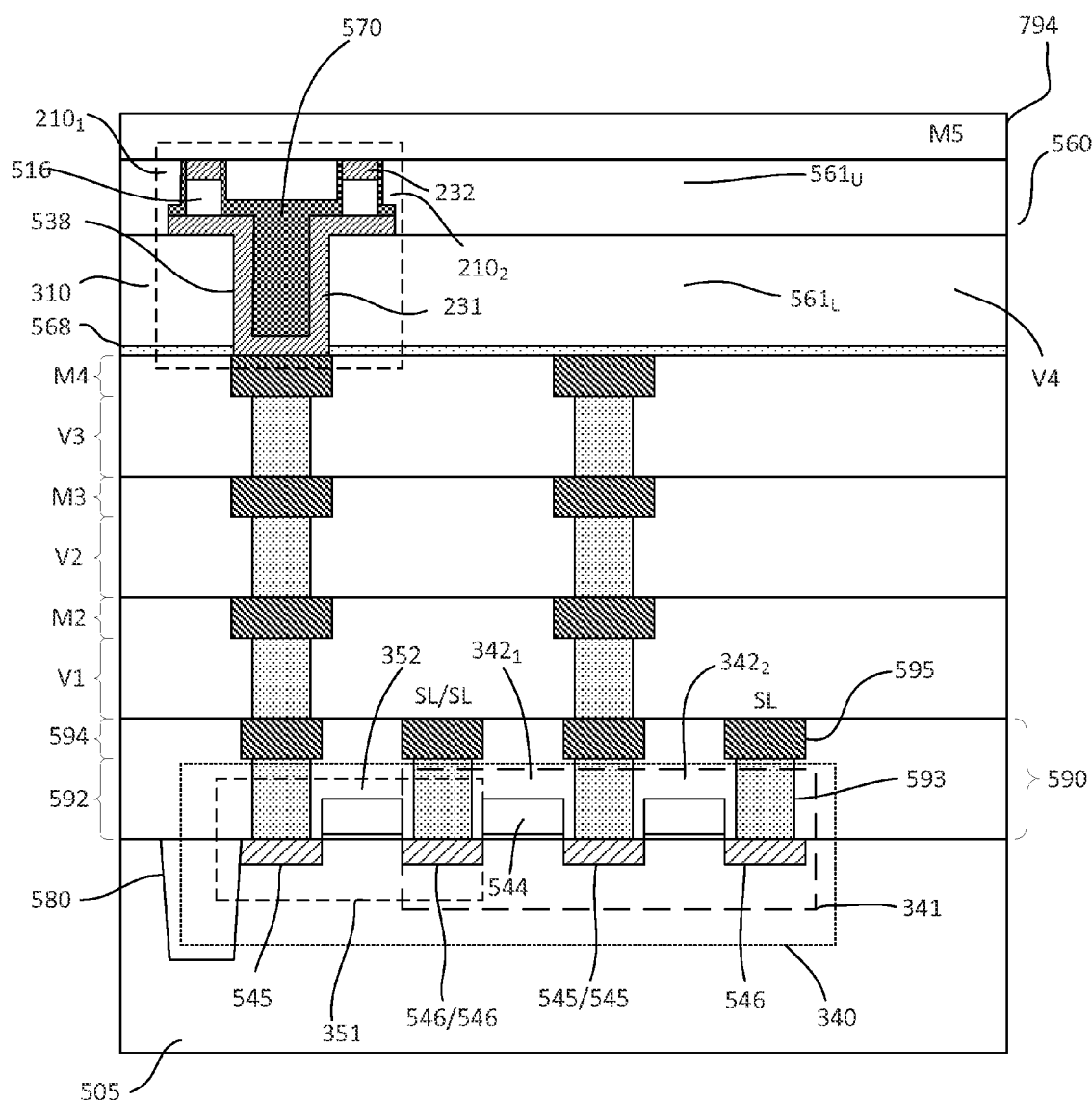
Figure 7Q:
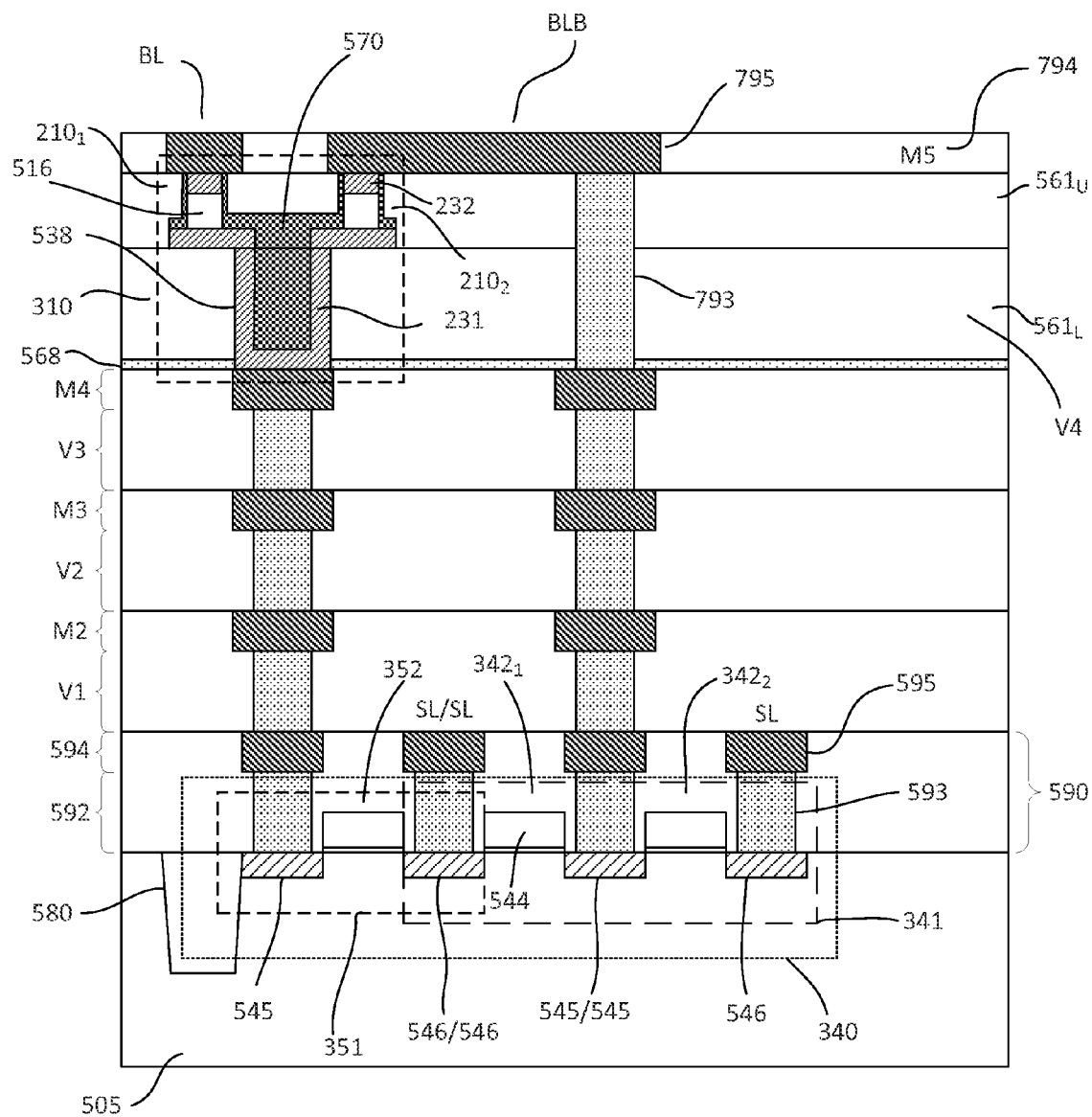

FIGS. 7a-7q show cross-sectional views of a process of forming an embodiment of a device 700. The process includes forming a memory cell. The memory cell, for example, may be a NVM memory cell. The memory cell, in one embodiment, is a magnetic resistive NVM cell, such as a STT-MRAM cell. The memory cell, for example, is similar to that described in FIGS. 5a-5c. Common elements may not be described or described in detail. The cross-sectional views, for example, are along the bitline direction. For example, the cross-sectional views show gates and S/D regions of select transistors of the memory cell. Although the cross-sectional views show one memory cell, it is understood that the device includes a plurality of memory cells of, for example, a memory array. In one embodiment, the process of forming the STT-MRAM cell is highly compatible with the CMOS logic process. For example, the STT-MRAM cell can be formed simultaneously with CMOS logic devices (not shown) on the same substrate.

Referring to FIG. 7a, a substrate 505 is provided. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

As shown, the substrate may include a cell region in which a memory cell is formed. The cell region may be part of an array region. For example, the array region may include a plurality of cell regions. The substrate may include other types of device regions, such as a logic region. Other types of regions may also be provided.

Isolation regions 580 may be provided. In one embodiment, the isolation regions are shallow trench isolation (STI) region. Other types of isolation regions may also be useful. The isolation regions are provided to isolate device regions from other regions. In one embodiment, isolation regions may be provided to isolate columns of memory cells. Isolation regions may be provided to isolate different memory array banks. Other configurations of isolation regions may also be useful. Isolation regions may be formed by, for example, etching trenches in the substrate and filling them with a dielectric material, such silicon oxide. A planarization process, such as chemical mechanical polish (CMP), is performed to remove excess dielectric material, leaving, for example, STI regions isolating device regions.

The cell region may include a cell device well (not shown). The cell device well, for example, serves as a body well for transistors of the memory cell. The device well may be doped with second polarity type dopants for first polarity type transistors. The device well may be lightly or intermediately doped with second polarity type dopants. For example, the device well may have a dopant concentration of about $1E10-1E14/cm^2$. Other dopant concentrations may also be useful. In some cases, a cell device isolation well (not shown) may be provided, encompassing the cell device well. The isolation well may have a dopant type which has the opposite polarity to that of the array well. For example, the isolation well may include first polarity type dopants. The isolation well serves to isolate the cell device well from the substrate. Well biases may be provided to bias the wells. The cell device well and the cell device isolation well can be biased at ground or biased differently, depending on the circuit design. For example, the cell device well is biased at ground while the cell device isolation well is biased at a suitable voltage.

The cell device well may be a common well for the cell device regions in the array region. For example, the cell device well may be an array well. The cell device isolation well may serve as an array isolation well. Other configurations of device and isolation wells may also be useful. Other device regions of the device may also include device and/or device isolation wells. The wells may be formed by, for example, ion implantation. Different implantations may be performed for different types of doped wells. The wells, for example, may be formed using an implant mask, such as a patterned photoresist mask. Other techniques in forming the wells may also be useful. The wells are formed after forming the isolation regions.

Transistors are formed on the substrate. For example, transistors of a cell selector unit 340 are formed on the substrate. In one embodiment, the cell selector unit includes a write channel selector 341 and a read channel selector 351. The write selector includes first and second write select transistors 342₁ and 342₂ while the read selector includes a read select transistor 352. The transistors, for example, are MOS transistors. Other suitable types of transistors or cell selectors may also be useful.

A transistor includes first and second S/D regions 545 and 546 formed in the substrate and a gate 544 disposed on the substrate between the S/D regions. To form the transistors, layers of the gate may be formed on the substrate. For example, a gate dielectric layer and gate electrode layer may be sequentially formed on the substrate. The gate dielectric layer, for example, may be a silicon oxide layer formed by, thermal oxidation. As for the gate electrode layer, it may be a polysilicon layer formed by chemical vapor deposition (CVD). Other suitable types of gate layers or techniques for forming gate layers may also be useful.

The gate layers may be patterned to form gates of the transistors. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to location where the gate layers are to be removed. To improve lithographic resolution, an anti-reflective coating (not shown) may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. Patterning the gate layers forms gates of the select transistors. The gates, for example, may be a gate conductor along a first or wordline direction. A gate conductor forms a common gate for a row of memory cells.

The S/D regions are formed after forming the gates. To form the S/D regions, first polarity type ions are implanted into the substrate adjacent to the gates. In one embodiment, the implant forms heavily doped S/D regions in the substrate adjacent to the gates. In some cases, LD regions may be formed. The LD regions are formed prior to forming the heavily doped S/D regions. For example, a LD implant is performed to form LD regions, followed by forming dielectric spacers on gate sidewalls. The implant to form the S/D regions is performed after sidewall spacers formation. As shown, adjacent select transistors share a common S/D region. In one embodiment, second S/D regions of the read select transistor and first write select transistor form a common second S/D region while first S/D regions of the write select transistors form a common first S/D region. In another embodiment, adjacent select transistors need not share a common S/D region. Other configurations of select transistors may also be useful.

Referring to FIG. 7b, a lower dielectric layer 592 is formed on the substrate, covering the transistors. The dielectric layer, for example, serves as a lower dielectric layer of an ILD layer. In one embodiment, the dielectric layer serves as a lower dielectric layer of the ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

In one embodiment, contacts 593 are formed in the dielectric layer. The contacts, for example, connect to contact regions, such as S/D regions and gates of the transistors. Forming the contacts may include forming contact vias in the dielectric layer to expose the contact regions. Forming the contact vias may be achieved using mask and etch techniques, as previously described. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

In FIG. 7c, an upper dielectric layer 594 is formed over the substrate, covering the lower dielectric layer. The upper dielectric layer, for example, serves as a metal level of an ILD layer. In one embodiment, the upper dielectric layer serves as M1 level of the ILD layer. The upper dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed to produce a planar surface.

Conductive lines 595 are formed in the upper dielectric layer. The conductive lines may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, SLs are coupled to the second S/D regions of the select transistors. In one embodiment, the second S/D regions are coupled to a common SL and are coupled to, for example, GND. As for the first S/D contacts, they are coupled to contact pads or islands in M1. The contact pads provide connections to upper ILD levels.

As shown in FIG. 7d, additional ILD layers are formed over the upper dielectric layer. As show, second to fourth ILD layers are formed over the upper dielectric layer. For example, the second ILD layer (V1, M2), third ILD layer (V2, M3) and fourth ILD layer (V3, M4) are formed over the upper dielectric layer. Forming less or more ILD layers over M1 may also be useful. These ILD layers may be referred to as intermediate ILD layers.

An intermediate ILD layer includes a metal level Mx and a contact level Vx-1. The metal level includes conductors or metal lines while the contact level includes contacts. The ILD layer may be formed of silicon oxide. Other types of dielectric materials, such as low k, high k or a combination of dielectric materials may also be useful. The ILD layer may be formed by, for example, CVD. Other techniques for forming the ILD layer may also be useful.

A dielectric liner may be disposed between ILD levels and cell dielectric layer. The dielectric liner, for example, serves as an etch stop layer. The dielectric liner may be formed of a low k dielectric. For example, the dielectric liner may be nBLOK. Other types of dielectric materials for the dielectric liner may also be useful.

The conductors and contacts may be formed by dual damascene technique. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed, forming conductor and contacts in the intermediate ILD layer. In one embodiment, contact pads and contact vias are provided in the ILD layers, connecting to the contact pads in the upper dielectric layer. This provides connection to the first S/D regions of the select transistors. Other configurations or techniques for forming intermediate ILD layers may also be useful.

Referring to FIG. 7e, a dielectric liner 568 is formed over the upper intermediate ILD layer. For example, the dielectric liner is formed over M4. The dielectric liner, for example, serves as an etch stop layer. The dielectric liner may be formed of a low k dielectric. For example, the dielectric liner may be nBLOK. Other types of dielectric materials for the dielectric liner may also be useful.

A cell dielectric layer is formed on the dielectric layer. In one embodiment, the cell dielectric layer serves as a lower cell dielectric layer $561_L$. The cell dielectric layer, for example, is a silicon oxide layer. The cell dielectric layer may be formed by, for example, CVD. Other types of cell dielectric layers or forming techniques may also be useful. The thickness of the lower cell dielectric layer, for example, is about 50-150 nm. Other suitable thickness dimensions may also be useful.

As shown in FIG. 7f, a first mask layer 780 is formed over the cell dielectric layer. The mask layer, for example, may be a photoresist layer. To improve lithographic resolution, an anti-reflective coating ARC layer may be provided between the mask and cell dielectric layers. The mask layer is patterned to form an opening. The opening corresponds to the contact pad in the ILD layer below. An etch, such as RIE, removes exposed dielectric material of the cell dielectric layer. The etch also removes the dielectric liner below. This forms a via opening 766, exposing the contact pad in, for example, M4. This enables a connection to be formed to the first S/D region of the read transistor. The patterned resist mask layer is removed after patterning the dielectric layer. The mask layer may be removed by, for example, ashing. Other techniques for removing the mask layer may also be useful.

A bottom electrode layer 731 is formed on the substrate. The bottom electrode layer lines the surface of the cell dielectric layer and sides and bottom of the via. The bottom electrode layer does not fill the via, leaving a bottom electrode trench 767. The bottom electrode layer, for example, may be Ta or TaN layer. The bottom electrode layer may be formed by, for example, sputtering. Other materials or techniques for forming the bottom electrode layer may also be useful.

Referring to FIG. 7h, MTJ layers 716 are formed on the substrate. The MTJ layers may be formed to result in a top or bottom pinned MTJ element. The MTJ layers include layers between top and bottom electrodes. Various MTJ layers may include those described in FIGS. 2a-2b. Other types of layers for forming other types of MTJ layers may also be useful. For example, other types of MTJ layers may be employed to form other types of MTJ elements. The layers may be formed by, for example, CVD. Other techniques may also be useful for forming the MTJ layers.

After forming the MTJ layers, a top electrode layer 732 is formed on the substrate. The top electrode layer, for example, may be Ta or TaN layer. The top electrode layer may be formed of the same material as the bottom electrode layer. Forming the electrode layers using different materials may also be useful. The top electrode layer may be formed by, for example, sputtering. Other techniques or materials for forming the top electrode may also be useful. After forming the top electrode layer, a planarization process, such as CMP, may be performed to produce a planar top surface.

In FIG. 7i, a second mask layer 781 is formed over the top electrode layer. The mask layer, for example, may be a photoresist layer. To improve lithographic resolution, an ARC layer may be provided between the mask and top electrode layers. The mask layer is patterned to form openings. The openings correspond to areas where the top electrode layer and MTJ layers are to be removed. An etch, such as RIE, removes exposed top electrode and MTJ layers. Multiple etches may be employed due to the different materials. The etch is selective to the bottom electrode. The etch, as shown, leaves MTJ stacks or storage plugs 516 with top electrodes 232 as shown in FIG. 7*j*.

Referring to FIG. 7*k*, the mask layer is removed. The mask layer may be removed by, for example, ashing. Other techniques for removing the mask layer may also be useful. A passivation layer 770 is formed on the substrate. The passivation layer, for example, may be SiN layer. The passivation layer lines the surface of the bottom electrode and MTJ stacks with top electrodes as well as filling the bottom electrode trench. In one embodiment, the passivation layer is formed by CVD. Other suitable passivation materials and techniques for forming the passivation layer may also be useful.

A dielectric layer 763 is formed over the substrate, covering the MTJ layers and passivation layer as shown in FIG. 7*l*. The dielectric layer may serve as a part of an upper cell dielectric layer. As shown, the thickness of the dielectric layer should be sufficient to exceed the top of the MTJ stacks with the top electrodes. After forming the dielectric layer, a planarization process is performed. For example, the CMP planarizes the substrate, forming a planar top surface with the dielectric layer. In one embodiment, the CMP leaves the top electrodes unexposed.

As shown in FIG. 7*m*, a third mask layer 782 is formed over the dielectric layer. The mask layer, for example, may be a photoresist layer. To improve lithographic resolution, an ARC layer may be provided between the mask and cell dielectric layers. The mask is patterned to form an opening. The pattern of the mask corresponds to the storage unit to be formed. For example, the patterned mask protects the region of the substrate where the storage unit is to be formed while other regions are exposed.

Referring to FIG. 7*n*, an etch, such as RIE, removes exposed dielectric material as well as the passivation and bottom electrode layers below. The etch forms the storage unit 310 with first and second storage elements $210_1$ and $210_2$. An overetch may be performed to ensured that the bottom electrode layer outside the storage unit is completely removed. As shown, the remaining passivation layer 570 fills the bottom electrode trench while the remaining bottom electrode lines the cell trench 538. After forming the storage unit, the third mask is removed. The third mask, for example, is removed by ashing. Other techniques for removing the mask may also be useful.

A dielectric layer is formed over the substrate, as shown in FIG. 7*o*. The dielectric layer serves as an upper cell dielectric layer $561_U$. The dielectric layer fills the area outside of the storage unit. The dielectric layer should be sufficient to fill the regions outside the storage unit to provide a top surface over the top electrodes on the MTJ stacks. The substrate is planarized. For example, the substrate is polished by CMP, removing excess dielectric material. The polishing leaves a planar top surface between the upper cell dielectric layer and top electrodes.

The lower and upper cell dielectric layer forms the cell dielectric layer 560. The cell dielectric layer may serve as a contact or via level of an ILD layer. For example, the cell dielectric layer may serve as V4 of the fifth ILD level. Other via levels may also be useful.

In FIG. 7*p*, a dielectric layer 794 is formed over the substrate, covering the cell dielectric layer. The dielectric layer, for example, serves as a metal level of an ILD layer. In one embodiment, the dielectric layer serves as a metal level of the cell dielectric level. For example, the dielectric layer serves as M5 while the cell dielectric layer serves as V4. Other ILD levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed to produce a planar surface.

As shown in FIG. 7*q*, conductive lines 795 and contacts 793 are formed in the metal layer dielectric layer and the cell dielectric layer. The conductive lines and contacts may be formed using, for example, dual damascene techniques. For example, BLB may be formed with a contact connecting to the contact pad in the metal level below, such as M4. BLB also connects to the top electrode of the second MTJ element $210_2$. This provides a connection for BLB to the first S/D regions of the write select transistors. As for the first MTJ element $210_1$, it is connected to BL in the metal level. This provides a connection for BL to the first S/D region of the read select transistor.

The embodiments as described above result in advantages. As shown in FIGS. 3*b*-3*c* and FIGS. 5*b*-5*c*, the read and write paths are controlled by different switches. In addition, during the write operation, the configuration of the memory cell allows for complementary writing of two MTJ elements simultaneously. For example, during the write operation, the first and second MTJ elements are in opposite states such that one of the first and second MTJ elements is in a parallel state and the other of the first and second MTJ elements is in an anti-parallel state. Such configuration enables the use of the ratio of the two MTJ element's resistance to store information. Furthermore, during the read operation, the configuration of the memory cell allows for complementary reading of the two MTJ elements simultaneously. For example, the first and second MTJ elements can be read via the first and second bit lines in a parallel manner. The configuration provides high sensing margin, faster sensing for read operation without the need for read reference. Moreover, the configuration of the memory cell enables low power requirement and allows for stackable multi-cell configuration to be achieved.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory cell comprising:
   a first magnetic tunnel junction (MTJ) element coupled to a first bit line;
   a second MTJ element coupled to a second bit line, wherein the first and second MTJ elements have a common node;
   a first selector having a first selector first select transistor with a first gate coupled to a first wordline and first and second source/drain (S/D) regions, wherein the common node of the first and second MTJ elements is coupled to the first S/D region of the first selector first select transistor; and a second selector having a second selector first select transistor with a second gate coupled to a second wordline and first and second S/D regions, and a second selector second select transistor with a third gate coupled to the second wordline and first and second S/D regions, wherein the first S/D regions of the second selector first select transistor and second selector second select transistor are a common first S/D region coupled to the second bitline.

2. The memory cell of claim 1 wherein the first word line is a read wordline and the second wordline is a write wordline.

3. The memory cell of claim 2 wherein the second S/D regions of the first selector first select transistor and second selector first select transistor are a common second S/D region and the common second S/D region is coupled to ground.

4. The memory cell of claim 2 wherein the second selector first select transistor and second selector second select transistor are coupled in parallel.

5. The memory cell of claim 1 wherein each of the first and second MTJ elements comprises:
a top electrode;
a bottom electrode;
a MTJ stack in between the top and bottom electrodes, wherein the MTJ stack comprises a magnetically free layer, a magnetically fixed layer and a tunneling barrier layer between the free and fixed layers.

6. The memory cell of claim 5 wherein the bottom electrodes of the first and second MTJ elements are a common bottom electrode.

7. A method of operating a memory cell comprising:
providing a memory cell comprising
a first magnetic tunnel junction (MTJ) element coupled to a first bit line;
a second MTJ element coupled to a second bit line, wherein the first and second MTJ elements have a common node;
a first selector having a first selector first select transistor with a first gate terminal coupled to a first wordline and first and second S/D terminals, wherein the common node of the first and second MTJ elements is coupled to the first S/D terminal of the first selector first select transistor,
a second selector having
a second select transistor with a second gate terminal coupled to a second wordline and first and second S/D terminals,
a third select transistor with a third gate terminal coupled to the second wordline and first and second S/D terminals, wherein the first S/D terminals of the second and third select transistors are a common first S/D terminal; and
performing a read operation or write operation with the memory cell.

8. The method of claim 7 wherein:
the first wordline is a read wordline and the second wordline is a write wordline; and
the second S/D terminals of the first and second select transistors are coupled to a common source line.

9. The method of claim 8 wherein performing a read operation comprises:
providing an active read signal to the read wordline and providing an inactive signal to the write wordline; and
forming a read path from the first and second bitlines to ground.

10. A method of operating a memory cell comprising:
providing a memory cell comprising
a first selector having a first select transistor with a first gate terminal coupled to a read wordline and first and second S/D terminals,
a second selector having
a second select transistor with a second gate terminal coupled to a write wordline and first and second S/D terminals,
a third select transistor with a third gate terminal coupled to the write wordline and first and second S/D terminals, wherein the first S/D terminals of the second and third select transistors are a common first S/D terminal,
wherein the second S/D terminals of the first and second select transistors are coupled to a common source line,
a first magnetic tunnel junction (MTJ) element coupled between a first bit line and the first S/D terminal of the first select transistor, and
a second MTJ element coupled to a second bit line and the first S/D terminals of the second and third select transistors; and
performing a read operation or write operation with the memory cell, wherein performing a write operation comprises:
providing an active write signal to the write wordline and providing an inactive signal to the read wordline; and
forming a write path from the first bitline to source line by floating the second bitline.

11. The method of claim 10 wherein, during the write operation, the first and second MTJ elements are in two opposite states such that one of the first and second MTJ elements is in a parallel state and the other of the first and second MTJ elements is in an anti-parallel state.

12. A method for forming a memory cell comprising:
providing a cell selector unit on a substrate comprising
forming a first selector having a first selector first select transistor with a first gate and first and second S/D regions,
forming a second selector which comprises forming a second selector first select transistor with a second gate and first and second S/D regions, and a second selector second select transistor with a third gate and first and second S/D regions;
providing a cell dielectric layer on the substrate;
forming a storage unit in the cell dielectric layer which comprises forming first and second magnetic tunnel junction (MTJ) elements;
forming an upper metal level over the cell dielectric layer which comprises forming first and second bitlines in the upper metal level;
coupling the first gate of the first selector first select transistor to a first wordline;
coupling the second and third gates of the second selector first select transistor and second selector second select transistor to a second wordline;
coupling the first MTJ element between the first bit line and the first S/D region of the first selector first select transistor; and
coupling the second MTJ element to the second bit line and the first S/D region of the second selector first select transistor.

13. The method of claim 12 wherein the first S/D regions of the second selector first select transistor and second selector second select transistor are common first S/D regions coupled to the second bit line.

14. The method of claim 13 wherein the second S/D regions of the first selector first select transistor and second selector first select transistor are a common second S/D region.

15. The method of claim 14 wherein the first wordline is a read wordline and the second wordline is a write wordline.

16. The method of claim 14 comprising coupling the common second S/D region to ground.

17. The method of claim 13 wherein the second selector first select transistor and second selector second select transistor are coupled in parallel.

18. The method of claim 12 wherein forming the first and second MTJ elements comprises:
   forming a top electrode layer and a bottom electrode layer in the cell dielectric layer;
   forming MTJ stack layers in between the top and bottom electrodes, wherein the MTJ stack comprises a magnetically free layer, a magnetically fixed layer and a tunneling barrier layer between the free and fixed layers.

19. The method of claim 18 wherein forming the first and second MTJ elements comprises:
   patterning the top electrode layer and the MTJ stack layers to define the top electrode and MTJ stack of the respective first and second MTJ element; and
   patterning the bottom electrode layer to define a common bottom electrode for the first and second MTJ elements.

20. The method of claim 12 wherein forming the first and second MTJ elements comprises forming a common bottom electrode for the first and second MTJ elements; and coupling the common bottom electrode of the first and second MTJ elements to the first S/D region of the first selector first select transistor.

* * * * *